(12) United States Patent  (10) Patent No.: US 9,654,186 B2
Nakayama  (45) Date of Patent: May 16, 2017

(54) PORTABLE TERMINAL

(71) Applicant: KYOCERA Corporation, Kyoto-shi, Kyoto (JP)

(72) Inventor: Eiji Nakayama, Osaka (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/167,678

(22) Filed: May 27, 2016

(65) Prior Publication Data

US 2016/0277074 A1 Sep. 22, 2016

(30) Foreign Application Priority Data

Nov. 27, 2013 (JP) ................................. 2013-244702

(51) Int. Cl.
H04B 5/00 (2006.01)
H04B 5/02 (2006.01)
H03G 3/30 (2006.01)

(52) U.S. Cl.
CPC ............. *H04B 5/02* (2013.01); *H03G 3/3078* (2013.01); *H04B 5/0031* (2013.01); *H04B 5/0056* (2013.01); *H04B 5/0081* (2013.01)

(58) Field of Classification Search
CPC .. H03G 3/3078; H04B 5/0081; H04B 5/0056; H04B 5/0031; H04B 5/02
See application file for complete search history.

(56) References Cited

U.S. PATENT DOCUMENTS

2005/0159913 A1 7/2005 Ariyoshi et al.
2010/0171617 A1 7/2010 Sano

2014/0073242 A1* 3/2014 Chen .................... H04B 5/0056
455/41.1

(Continued)

FOREIGN PATENT DOCUMENTS

JP 2005-130203 A 5/2005
JP 2006-265943 A 10/2006
JP 2008-283590 A 11/2008

(Continued)

OTHER PUBLICATIONS

International Search Report and Written Opinion of the International Searching Authority issued by the Japanese Patent Office for International Application No. PCT/JP2014/081407.

*Primary Examiner* — Ping Hsieh
(74) *Attorney, Agent, or Firm* — Procopio Cory Hargeaves and Savitch LLP

(57) ABSTRACT

A portable terminal includes an antenna, a communication unit, an N-bit counter, and a gain change unit. The communication unit has two modes of an active mode in which the communication unit itself outputs carrier waves and a passive mode in which carrier waves output from another device are used, and is configured to attempt communication through electromagnetic induction by using the antenna with switching between the two modes being alternately made and to communicate without switching between the modes while communication is established. The N-bit counter is configured to output a value which varies by a unit number each time switching to at least one of the two modes is made in the communication unit. The gain change unit is configured to change a gain of a signal received at the antenna by the communication unit in accordance with a value output from the N-bit counter.

6 Claims, 19 Drawing Sheets

(56) References Cited

U.S. PATENT DOCUMENTS

2015/0286322 A1* 10/2015 Duteil .................. H04B 5/0062
345/173

FOREIGN PATENT DOCUMENTS

| JP | 2010-161483 A | 7/2010 |
|----|---------------|--------|
| JP | 2010-247906 A | 11/2010 |
| JP | 2011-170928 A | 9/2011 |

* cited by examiner

FIG.11

| STATUS | POLLING PROCESSING | COMMUNICATION |
|---|---|---|
| 0 | RESISTANCE VALUE Ra | RESISTANCE VALUE Rb |
| 1 | RESISTANCE VALUE Ra | RESISTANCE VALUE Ra |

FIG.18

| STATUS | POLLING PROCESSING | COMMUNICATION | VARIABLE RESISTANCE VALUE |
|---|---|---|---|
| 0 | RESISTANCE VALUE Ra | RESISTANCE VALUE Rb | SEARCH VALUE |
| 1 | RESISTANCE VALUE Ra | RESISTANCE VALUE Ra | SEARCH VALUE |
| 2 | RESISTANCE VALUE Ra | RESISTANCE VALUE Rb | MAXIMUM VALUE |

PORTABLE TERMINAL

CROSS-REFERENCE TO RELATED APPLICATION

The present application is a continuation based on PCT Application No. PCT/JP2014/081407 filed on Nov. 27, 2014, which claims the benefit of Japanese Application No. 2013-244702 filed on Nov. 27, 2013. PCT Application No. PCT/JP2014/081407 is entitled "Portable Terminal", and Japanese Application No. 2013-244702 is entitled "Portable Terminal". The content of which are incorporated by reference herein in their entirety.

FIELD

The present disclosure relates to a portable terminal including a wireless communication function.

BACKGROUND

Some portable terminals which have recently come to have more sophisticated functions have a function to emulate a contactless IC card (hereinafter referred to as a "card emulation function") for implementing a function such as credit card payment or electronic payment which has been performed by a contactless IC card. Such a portable terminal operates as a contactless IC card and communicates with a reader-writer through wireless communication as it is held over the reader-writer by a user.

SUMMARY

A portable terminal according to one embodiment of the present disclosure includes an antenna, a communication unit, an N-bit counter, with N being a natural number, and a gain change unit. The communication unit has two modes of an active mode in which the communication unit itself outputs carrier waves and a passive mode in which carrier waves output from another device are used. The communication unit is configured to attempt communication through electromagnetic induction by using the antenna with alternately switching between the two modes and to communicate without switching between the modes while communication is established. The N-bit counter is configured to output a value that varies by a unit number each time switching to at least one of the two modes is made in the communication unit. The gain change unit is configured to change a gain of a signal received at the antenna by the communication unit in accordance with the value output from the N-bit counter.

A portable terminal according to one embodiment of the present disclosure includes an antenna, a communication unit, and an intensity change unit. The communication unit is configured to communicate with another device through electromagnetic induction by using the antenna by outputting carrier waves from the communication unit itself. The intensity change unit is configured to change intensity of carrier waves transmitted from the antenna. The communication unit is configured to transmit an inquiry to another device over the carrier waves by polling and to communicate with another device over the carrier waves when communication is established by polling. The intensity change unit is configured to change intensity of the carrier waves to intensity lower than the intensity of the carrier waves in the polling when communication is established by the polling. The communication unit is configured to start communication with another device by transmitting the carrier waves lower in intensity than the carrier waves in the polling.

BRIEF DESCRIPTION OF THE DRAWINGS

FIG. 11 is a diagram illustrating a status of a portable terminal according to the second embodiment.

FIG. 18 is a diagram illustrating a status of a portable terminal according to the third embodiment.

DETAILED DESCRIPTION

Figure 1:
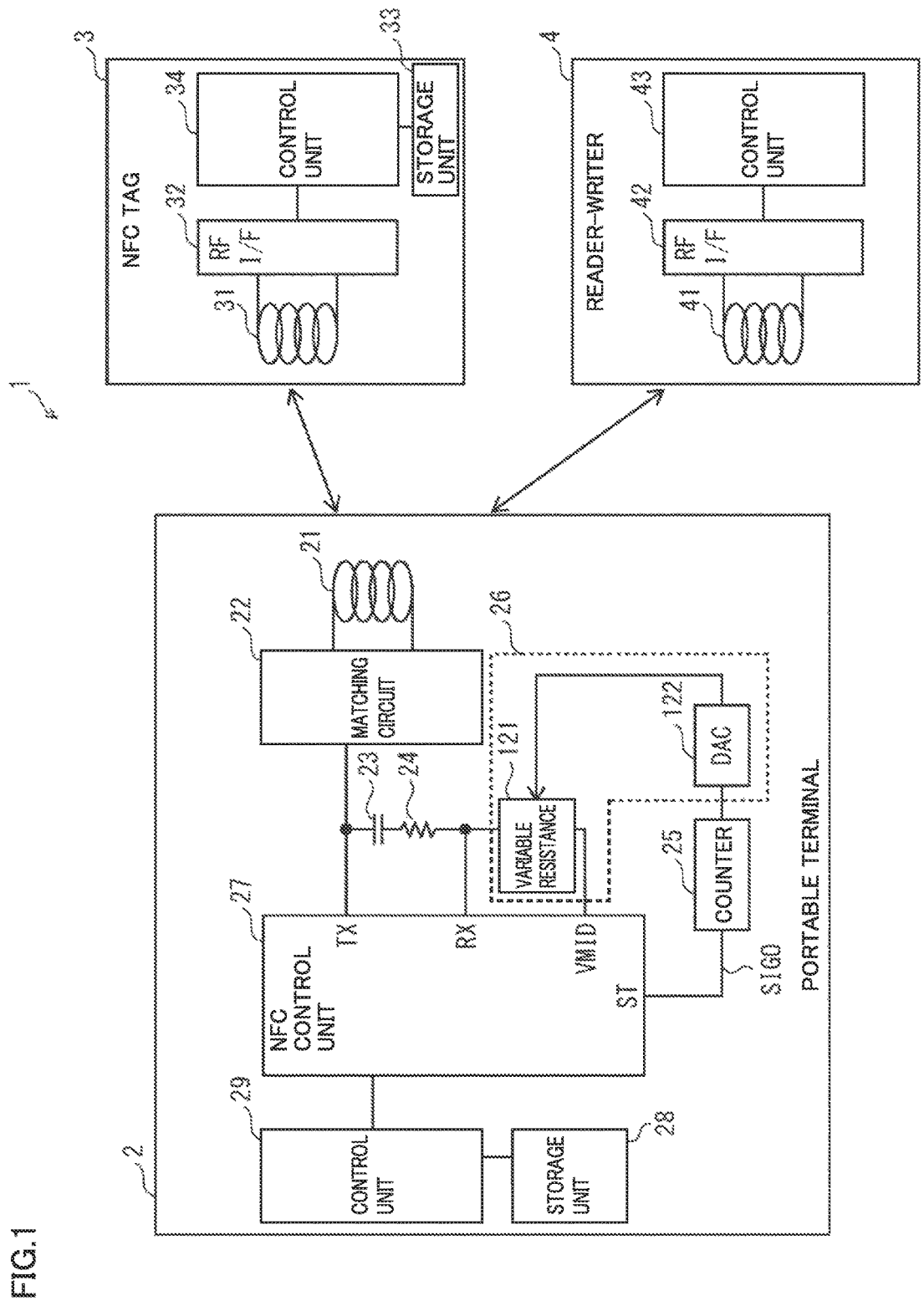
FIG. 1 is a block diagram showing a functional configuration of a communication system according to a first embodiment.

Embodiments will be described in detail with reference to the drawings. The same or corresponding elements in the drawings have the same reference characters allotted and description thereof will not be repeated.

A large scale integration (LSI) for wireless communication which has generally widely been used for a portable terminal does not have a circuit which adjusts a gain of a received signal. Addition of a circuit for adjusting a gain of a received signal to a portable terminal disadvantageously expands a circuit scale.

When a portable terminal communicates with a contactless IC card by outputting carrier waves, a high current should be fed to a loop antenna in order to generate intense magnetic field and hence current consumption disadvantageously increases.

[First Embodiment]

<1. Overview>

In some cases, a level of a signal received by a portable terminal may become excessive due to a short distance to a reader-writer in reception of a signal by the portable terminal and data cannot correctly be restored from the received signal. In such a case, in order to accommodate a level of a signal received by the portable terminal within an appropriate range, a user moves a position of the portable terminal so as to set an appropriate distance between the portable terminal and the reader-writer. It is inconvenient for a user, however, to be forced to move the position of the portable terminal.

Such inconvenience to a user as described above would not be caused if an LSI for wireless communication in the portable terminal had a circuit for adjusting a gain of a received signal. Such inconvenience to a user as described above, however, is not taken into account in the LSI for wireless communication which has generally widely been used, and the LSI does not have a circuit which adjusts a gain.

Therefore, in order to adjust a gain, an integrated circuit (IC) or a circuit for measuring a received signal strength indicator (RSSI) should be added to a portable terminal. In adding an IC or a circuit for measuring an RSSI to the portable terminal, however, a circuit for adjusting a gain with an RSSI value should further be added and a processor for executing a control program for controlling the same should also be added, which disadvantageously expands a circuit scale.

A portable terminal capable of adjusting a gain of a received signal with a configuration more simplified than a circuit for measuring an RSSI will be described in a first embodiment.

A communication system 1 according to the first embodiment will be described below with reference to the drawings. As shown in FIG. 1, communication system 1 includes a portable terminal 2, a near field communication (NFC) tag 3, and a reader-writer 4.

Portable terminal 2 can include a reader-writer function to operate as a reader-writer of a contactless IC card and a card emulation function to operate as a contactless IC card. Portable terminal 2 can exchange various types of data by communicating with NFC tag 3 when it operates as the reader-writer. Portable terminal 2 can exchange various types of data by communicating with reader-writer 4 when it operates as the contactless IC card.

Portable terminal 2 adjusts a gain of a received signal during communication, with a simplified circuit constituted of a counter, a DA converter, and a voltage division resistance as being combined, without using a large-scale circuit such as a circuit for measuring an RSSI.

<2. Portable Terminal 2>

Portable terminal 2 is represented by a smartphone by way of example. Portable terminal 2 can alternately repeat execution of the reader-writer function and execution of the card emulation function (see FIG. 2). For example, portable terminal 2 can execute the reader-writer function for 50 ms and can execute the card emulation function for 250 ms. When communication with NFC tag 3 is established while portable terminal 2 executes the reader-writer function, portable terminal 2 can continue execution of the reader-writer function until a series of communication processes ends even after lapse of 50 ms. When communication with reader-writer 4 is established while portable terminal 2 executes the card emulation function, portable terminal 2 can continue execution of the card emulation function until a series of communication processes ends even after lapse of 250 ms.

Portable terminal 2 can communicate in an active mode when it executes the reader-writer function. Portable terminal 2 can communicate in a passive mode when it executes the card emulation function. Details of communication in the active mode and the passive mode will be described later. Portable terminal 2 can also include general functions of the smartphone other than the functions above.

<2-1. Configuration>

Portable terminal 2 includes as a main functional configuration, an antenna 21, a matching circuit 22, a capacitor 23, a resistance 24, a counter 25, a gain change unit 26, an NFC control unit 27, a storage unit 28, and a control unit 29, as shown in FIG. 1.

Antenna (loop antenna) 21 is implemented by a coil obtained by annularly forming a conductor and can output electromagnetic waves as a current which flows through the coil varies. A current flows to antenna 21 with variation in magnetic flux which passes through the coil serving as antenna 21.

Matching circuit 22 can be implemented by combination of an inductor element and a capacitor element. Matching circuit 22 can match an impedance between antenna 21 and a circuit implementing portable terminal 2.

Capacitor 23 is implemented by a capacitor element and can include a function to cut off a DC component and to apply a bias voltage output from a terminal VMID to a received signal input to a terminal RX of NFC control unit 27.

Resistance 24 is implemented by a resistance element. Resistance 24 has a resistance value, for example, of 500Ω.

Counter 25 is implemented by an N (N=3, by way of example)-bit counter integrated circuit (IC) and can include a function to repeat counting from 0 to "(Nth power of 2)-1" and externally output a count value. A count value is used for determining a resistance value of a variable resistance 121. Variable resistance 121 has a resistance value, for example, of a count value×100Ω.

Counter 25 can detect a falling edge of an input pulse. Counter 25 can increment a count value by a unit number (1 by way of example) each time it detects a falling edge and can output the count value to gain change unit 26. When a falling edge of a pulse is detected with the count value being set to 7, counter 25 can return the count value to 0 without incrementing the count value by the unit number.

Gain change unit 26 can change a gain of a received signal in accordance with a count value output from counter 25. Gain change unit 26 can include variable resistance 121 and a DAC 122.

Variable resistance 121 is implemented by a variable resistor of which resistance value is varied in accordance with a voltage value of an input signal. A resistance value is defined, for example, as a voltage value of an input signal× 1000Ω. For example, when an input signal has a voltage value of 0 V (volt), variable resistance 121 has a resistance value of 0Ω, and when an input signal has a voltage value of 0.7 V, variable resistance 121 has a resistance value of 700Ω.

Variable resistance 121 and resistance 24 implement a resistance voltage division circuit. A voltage of a signal input to RX through matching circuit 22 from antenna 21 can be divided by the resistance voltage division circuit. The signal input to RX is converted to a digital value by an analog to digital (AD) converter contained in NFC control unit 27 and used in NFC control unit 27. Resistance values of resistance 24 and variable resistance 121 in the resistance voltage division circuit can be defined in advance such that a signal input to RX is accommodated in a range from 0 to 2 V which is a range of input of the AD converter.

DAC 122 is implemented by a digital to analog (DA) converter IC and can include a function to convert a digital signal to an analog signal. DAC 122 can obtain a count value output from counter 25 and can output a signal having a voltage in accordance with the obtained count value to variable resistance 121. A signal output from DAC 122 has a voltage value, for example, of a count value×0.1 V.

NFC control unit 27 is implemented by a control IC for wireless communication with a contactless IC card (NFC tag 3 by way of example) and a reader-writer (reader-writer 4 by way of example) through antenna 21. As shown in FIG. 1, NFC control unit 27 can include TX, RX, VMID, and ST as signal terminals.

TX represents an output terminal which outputs a signal for transmitting data to antenna 21. RX represents an input terminal to which a signal which is received by antenna 21, subjected to voltage division by resistance 24 and variable resistance 121, and biased with a bias voltage output from VMID is input. VMID represents an output terminal which outputs a bias voltage. ST represents an output terminal which outputs a signal SIG0 for operation debugging which indicates whether a communication mode currently set in NFC control unit 27 is the active mode or the passive mode.

The active mode is a mode in which NFC control unit 27 itself outputs carrier waves for communication. The passive mode is a mode in which data is transmitted and received by making use of electromagnetic waves output from a communication counterpart such as an external reader-writer. SIG0 can be set to an H level when the communication mode is set to the active mode and can be set to an L level when the communication mode is set to the passive mode. In portable terminal 2, SIG0 can be used as a pulse for input to counter 25, not for operation debugging.

NFC control unit 27 can include, as a main function, a communication control function for controlling communication by alternately setting the active mode and the passive mode. The communication control function will be described later. Storage unit 28 is implemented by a non-volatile memory such as a ferroelectric random access memory (FeRAM).

Control unit 29 can include at least one processor and a memory and can include a function to control overall operations of portable terminal 2. Each function of control unit 29 is implemented by execution of a program stored in a memory by at least one processor. Control unit 29 can include, as a main function, a function for control for implementing the reader-writer function in portable terminal 2 described above and for control for implementing the card emulation function.

NFC control unit 27 corresponds to one embodiment of the "communication unit" and counter 25 corresponds to one embodiment of an "N-bit counter." Gain change unit 26 corresponds to one embodiment of the "gain change unit."

<2-2. Communication Control Function of NFC Control Unit 27>

The communication function in the active mode of NFC control unit 27 and the communication function in the passive mode thereof will be described. In communication in the active mode and the passive mode, data to be communicated is subjected to cyclic redundancy check (CRC). NFC control unit 27 can check the CRC of reception data received from a communication counterpart and can determine that reception has been successful when the CRC was correct.

<2-2-1. Communication Function in Active Mode>
(1) Active Mode

The active mode is a communication mode used in execution of the reader-writer function by portable terminal 2. In communication in the active mode, NFC control unit 27 can transmit and receive data to and from a contactless IC card by outputting carrier waves from the NFC control unit itself. A frequency of the carrier waves is set to 13.56 MHz by way of example and a rate of communication is set to 212 kilo bits per second (kbps). The contactless IC card is implemented specifically by NFC tag 3.

In the active mode, in transmitting transmission data designated by control unit 29, NFC control unit 27 can subject the transmission data to Manchester coding and output carrier waves as being modulated under an amplitude shift keying (ASK) 10% scheme based on the coded transmission data. After transmission of the transmission data, NFC control unit 27 can continue to output a signal for a prescribed period. The carrier waves are thus transmitted from antenna 21. When a response to the transmitted data is given, NFC tag 3 which is a communication counterpart transmits data to portable terminal 2 by carrying out load modulation based on data to be transmitted as a response. NFC control unit 27 can retrieve reception data by demodulating the received signal received via antenna 21 under the ASK scheme and decoding the received signal under the Manchester coding scheme. NFC control unit 27 can output the retrieved reception data to control unit 29.

(2) Data Exchange Between Portable Terminal 2 and NFC Tag 3

When portable terminal 2 communicates in the active mode, portable terminal 2 can initially perform polling processing for identifying a communication counterpart which is present in the surroundings. In the polling processing, portable terminal 2 can transmit a polling request frame.

When NFC tag 3 receives a polling request frame, it can determine its own NFCID, for example, based on random numbers, and can transmit a polling response frame including the NFCID to portable terminal 2.

Portable terminal 2 can receive the polling response frame transmitted from NFC tag 3 and recognize the NFCID of NFC tag 3 which is the communication counterpart. As above, portable terminal 2 and NFC tag 3 can mutually recognize communication counterparts. Portable terminal 2 and NFC tag 3 mutually exchange various types of data. The polling request frame and the polling response frame are defined under ISO/IEC18092.

<2-2-2. Communication Function in Passive Mode>
(1) Passive Mode

The passive mode is a communication mode set in execution of the card emulation function by portable terminal 2. In communication in the passive mode, NFC control unit 27 can transmit and receive data to and from the reader-writer by making use of electromagnetic waves output from an external reader-writer. The external reader-writer is implemented specifically by reader-writer 4.

In the passive mode, NFC control unit 27 can receive from reader-writer 4, a signal transmitted from reader-writer 4 through modulation of carrier waves by reader-writer 4. NFC control unit 27 can retrieve data transmitted from reader-writer 4 by demodulating the received signal under the ASK 10% scheme and decoding the demodulated signal under the Manchester coding scheme. NFC control unit 27 can output the retrieved data to control unit 29.

When control unit 29 gives reader-writer 4 a response to the obtained data, it can output data to be transmitted to NFC control unit 27. NFC control unit 27 can code data obtained from control unit 29 under the Manchester coding scheme. NFC control unit 27 can transmit the data to reader-writer 4 by subjecting carrier waves output from reader-writer 4 to load modulation based on the coded data. The ASK scheme is adopted as a modulation scheme used for load modulation.
(2) Data Exchange Between Portable Terminal 2 and Reader-Writer 4

When portable terminal 2 communicates in the passive mode, initially, it can wait for normal reception of a polling request frame from reader-writer 4. When portable terminal 2 receives a polling request frame, portable terminal 2 can determine its own NFCID, for example, based on random numbers, and can transmit a polling response frame including the NFCID to reader-writer 4. Reader-writer 4 can receive the polling response frame and can recognize the NFCID of portable terminal 2 which is the communication counterpart. As above, portable terminal 2 and reader-writer 4 mutually recognize communication counterparts. Portable terminal 2 and reader-writer 4 can mutually exchange various types of data.
<3. NFC Tag 3>

NFC tag 3 is implemented by a contactless IC card. NFC tag 3 can include a function to communicate with a reader-writer by generating electric power from electromagnetic waves transmitted from the reader-writer. The reader-writer with which NFC tag 3 communicates is specifically portable terminal 2 which operates as the reader-writer by executing the reader-writer function. NFC tag 3 can operate by obtaining electric power through electromagnetic induction from electromagnetic waves output from portable terminal 2. NFC tag 3 includes as a main functional configuration, an antenna 31, a radio frequency interface (RF I/F) 32, a storage unit 33, and a control unit 34, as shown in FIG. 1.

Antenna (loop antenna) 31 is implemented by a coil obtained by annularly forming a conductor and can output electromagnetic waves as a current which flows through the coil varies. A current flows to antenna 31 with variation in magnetic flux which passes through the coil serving as antenna 31.

RF I/F 32 is implemented by an IC for contactless communication with a reader-writer through antenna 31. RF I/F 32 can include a data reception function and a data transmission function as main functions.

The data reception function is a function to receive data transmitted as portable terminal 2 modulates carrier waves. RF I/F 32 outputs received data to control unit 34. RF I/F 32 can retrieve data by demodulating a received signal under the ASK 10% scheme and decoding the signal under the Manchester coding scheme when it receives a signal through antenna 31.

The data transmission function is a function to transmit to portable terminal 2, data to be transmitted, which is obtained by control unit 34. Data can be transmitted by subjecting carrier waves transmitted by portable terminal 2 to load modulation. In transmission of data to portable terminal 2, RF I/F 32 can code the data under the Manchester coding scheme. Load modulation can be carried out under the ASK scheme based on the coded data.

Storage unit 33 is implemented by a non-volatile memory such as a ferroelectric random access memory (FeRAM).

Control unit 34 includes at least one processor and a memory and has a function to control overall operations of NFC tag 3. Each function of control unit 34 is implemented by execution of a program stored in a memory by at least one processor.

When control unit 34 receives a polling request frame through RF I/F 32, it can determine its own NFCID, for example, based on random numbers. Control unit 34 can instruct RF I/F 32 to transmit a polling response frame including the NFCID to portable terminal 2.

Thereafter, control unit 34 can perform processing in accordance with data received from portable terminal 2. For example, when data received from portable terminal 2 through RF I/F 32 is an instruction to transmit data stored in a prescribed area of storage unit 33, control unit 34 can read the data from the prescribed area in storage unit 33. Control unit34 can instruct RF I/F 32 to transmit the read data. When data received from portable terminal 2 through RF I/F 32 is an instruction to write prescribed data into a prescribed area in storage unit 33, control unit 34 can have the prescribed data written into the prescribed area in storage unit 33. The prescribed data can be transmitted from portable terminal 2 together with a write instruction.
<4. Reader-Writer 4>

Reader-writer 4 is a reader-writer for a contactless IC card. Reader-writer 4 can have a function to communicate with a contactless IC card and to read and write data from and into a contactless IC card. A contactless IC card with which reader-writer 4 communicates is specifically implemented by portable terminal 2 which operates as a contactless IC card as a result of execution of a card emulation mode. Reader-writer 4 can include as a main functional configuration, an antenna 41, an RF I/F 42, and a control unit 43 as shown in FIG. 1.

Antenna (loop antenna) 41 is implemented by a coil obtained by annularly forming a conductor and can output electromagnetic waves as a current which flows through the coil varies. A current can flow to antenna 41 with variation in magnetic flux which passes through the coil serving as antenna 41.

RF I/F 42 is implemented by an IC for contactless communication with a contactless IC card through antenna 41. RF I/F 42 can have a data transmission function and a data reception function as main functions.

The data transmission function is a function to transmit to portable terminal 2, data instructed to be transmitted by control unit 43. In transmission of data obtained from control unit 43, RF I/F 42 can subject the data to Manchester coding and output carrier waves as being modulated under the ASK 10% scheme based on the coded data.

As the data reception function, RF I/F 42 can continue to output carrier waves for a prescribed period after transmission of data with the data transmission function described above. When portable terminal 2 gives a response to transmitted data, the carrier waves can be subjected to load modulation by portable terminal 2. RF I/F 42 can retrieve data transmitted from portable terminal 2 by demodulating and decoding the carrier waves which have been subjected to load modulation. When RF I/F 42 retrieves data, the data can be demodulated under the ASK scheme and decoded under the Manchester coding scheme. RF I/F 42 can output the retrieved data to control unit 43.

Control unit 43 can include at least one processor and a memory and can include a function to control overall operations of reader-writer 4. Each function of control unit 43 is implemented by execution of a program stored in a memory by at least one processor.

Control unit 43 can instruct RF I/F 42 to transmit a polling request frame every prescribed time interval. When control unit 43 receives a polling response frame including an NFCID as a response to the polling request frame, control unit 43 can exchange various types of data through RF I/F 42 with a communication counterpart identified by the NFCID after reception, that is, with portable terminal 2.

<5. Operations>

<5-1. Procedure in Communication Processing

Figure 5:
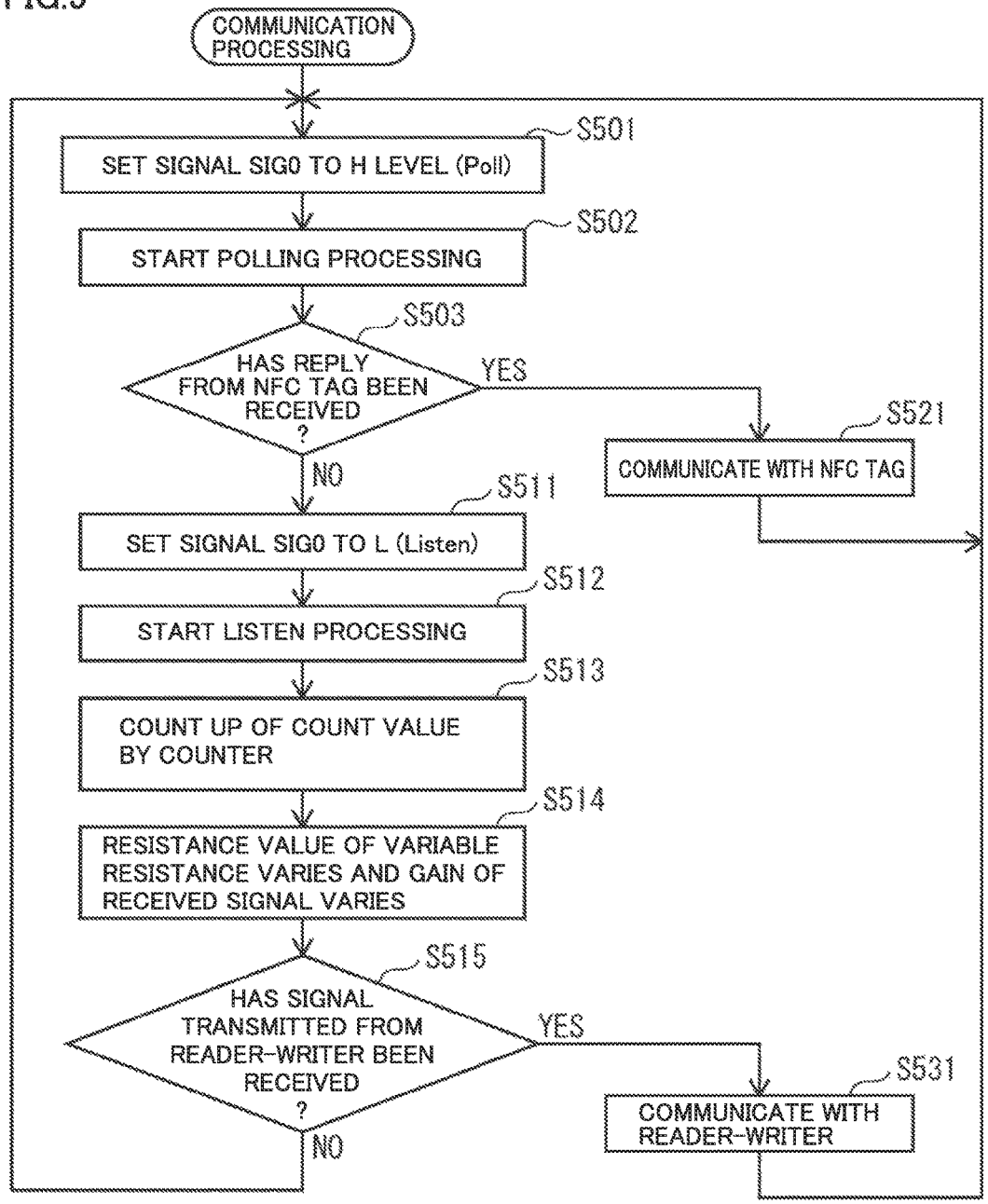
FIG. 5 is a flowchart showing a procedure in communication processing in the communication system according to the first embodiment.

A procedure in communication processing in communication system 1 configured as above will be described with reference to FIG. 5, with processing in portable terminal 2 being focused on.

Figure 2:
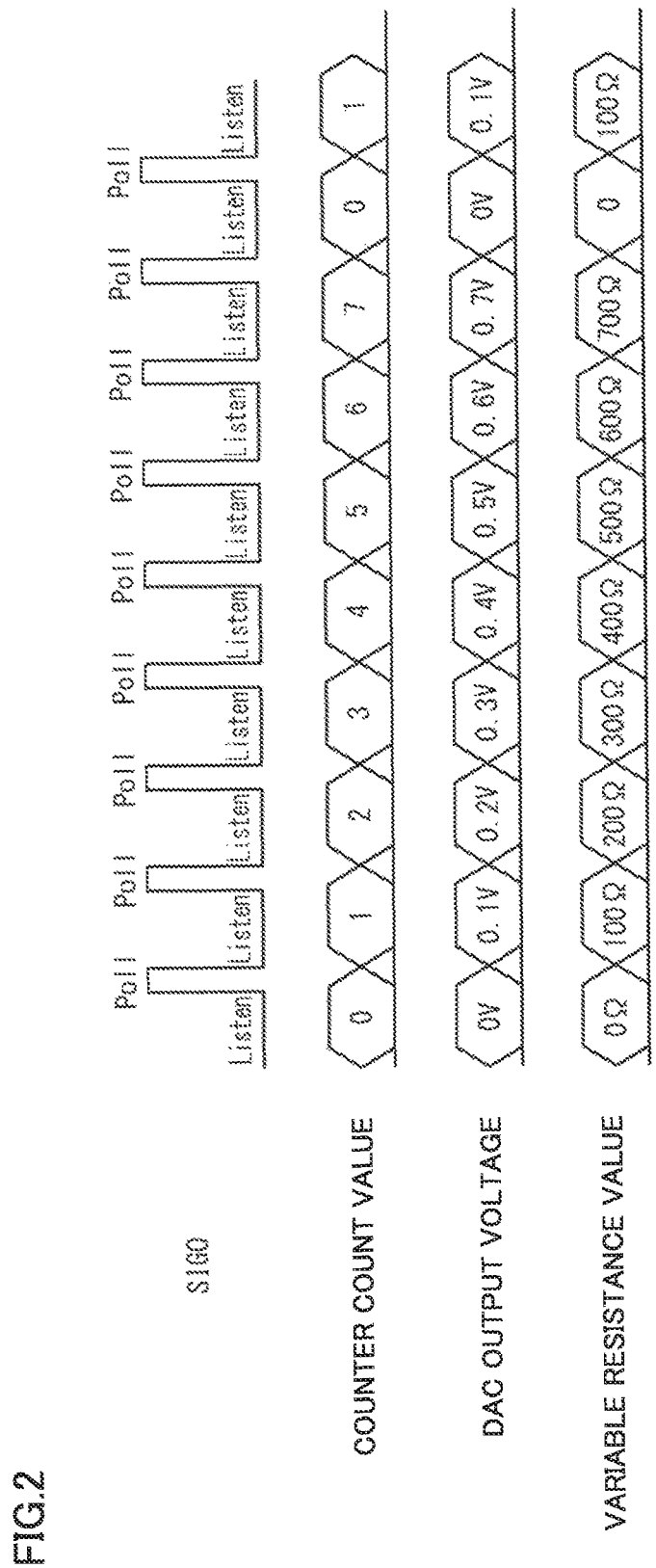
FIG. 2 is a timing chart of main signals during communication.
Figure 3:
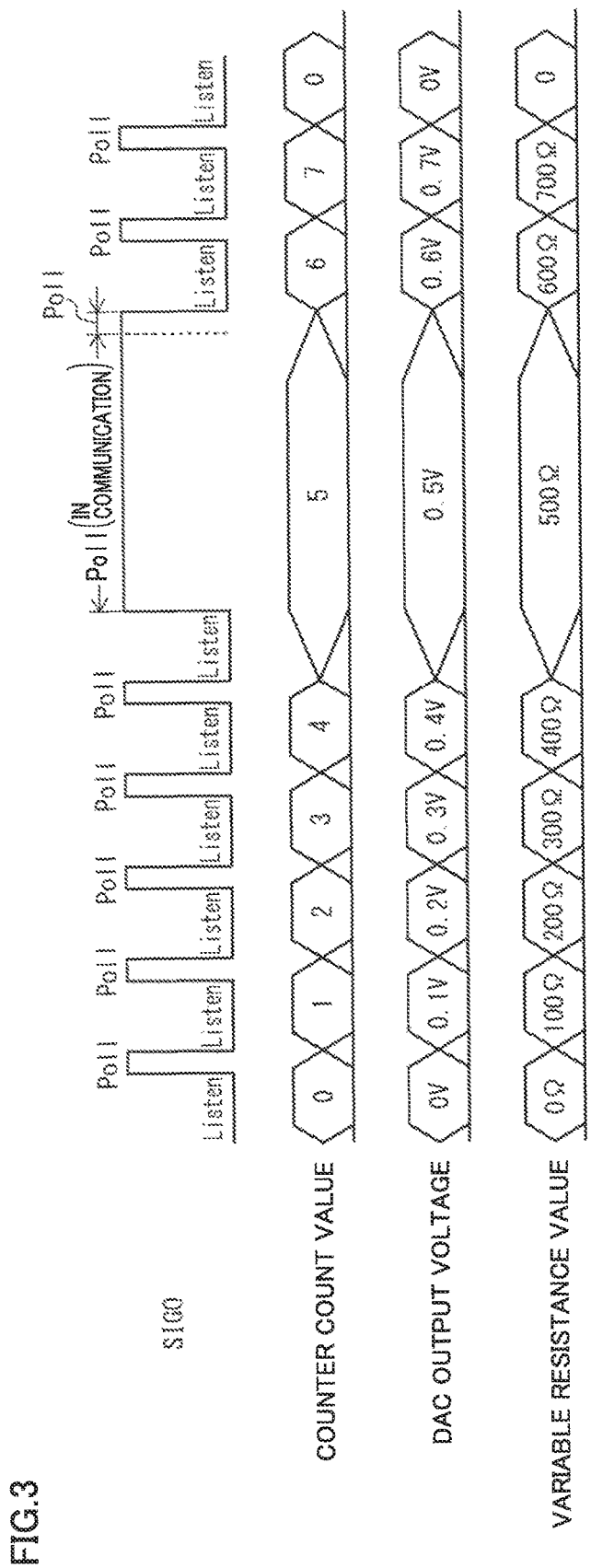
FIG. 3 is a timing chart of main signals during communication in an active mode.
Figure 4:
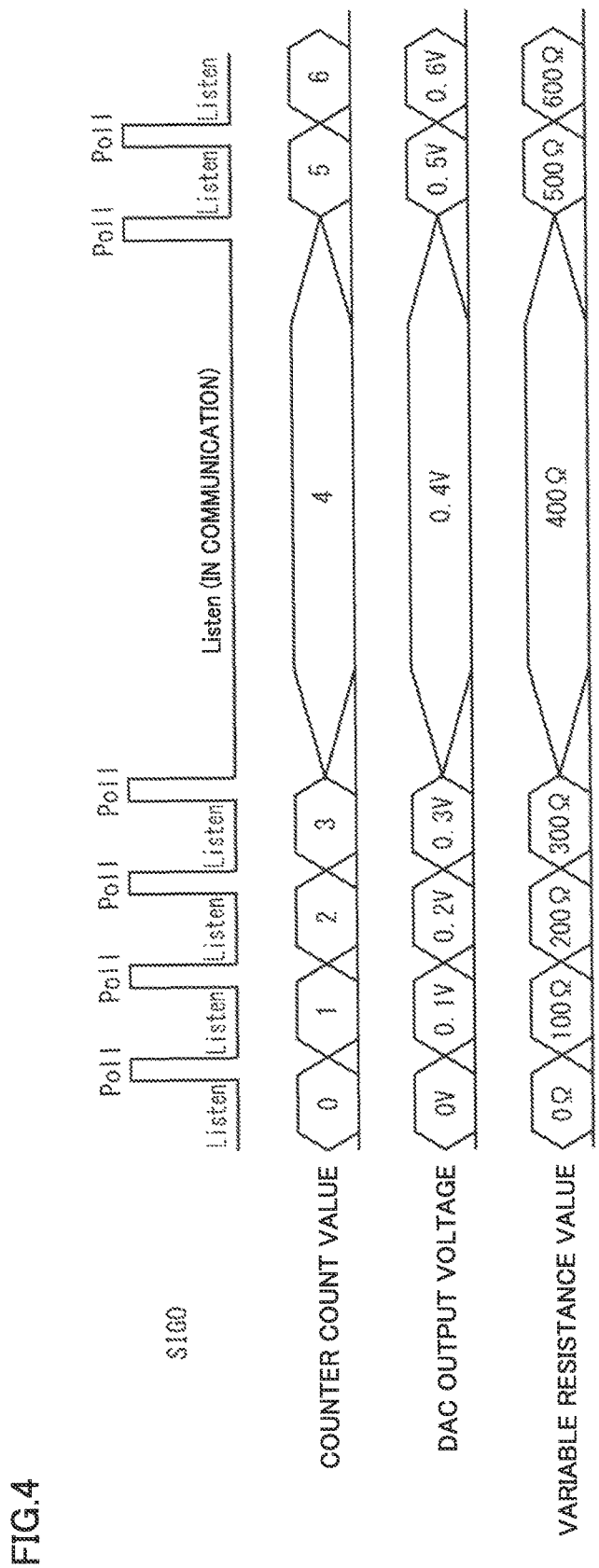
FIG. 4 is a timing chart of main signals during communication in a passive mode.

In step S501, NFC control unit 27 can switch the communication mode to the active mode and set SIG0 to the H level (Poll of SIG0 in FIGS. 2 to 4).

In step S502, NFC control unit 27 can start polling processing. NFC control unit 27 can transmit a polling request frame.

In step S503, control unit 29 can determine whether or not a reply from NFC tag 3 has been given. Whether or not a reply has been given can be determined based on whether or not NFC control unit 27 can normally receive a polling response frame from NFC tag 3 within a prescribed period (50 ms by way of example). When a reply has been given within the prescribed period, control unit 29 can communicate with NFC tag 3 by means of NFC control unit 27 (step S521). After communication is completed, the process can proceed to step S501. When no reply has been given, the process can proceed to step S511.

In step S511, NFC control unit 27 can switch the communication mode to the passive mode and can set SIG0 to the L level (Listen of SIG0 in FIGS. 2 to 4).

In step S512, NFC control unit 27 can start listen processing. In the listen processing, NFC control unit 27 can wait for reception of a polling request frame from reader-writer 4.

In step S513, counter 25 which has detected transition of signal SIG0 from the H level to the L level in step S511 can count up a count value. When the count value has been set to 7, counter 25 can return the count value to 0 without counting up the count value.

In step S514, DAC 122 can change a voltage to be output to variable resistance 121 to a voltage in accordance with the count value, in response to change in count value in step S513. The resistance value of variable resistance 121 varies in accordance with the voltage output from DAC 122. A ratio between the resistance value of resistance 24 and the resistance value of variable resistance 121 is thus varied so that a gain of a signal input to RX is changed in accordance with the ratio.

In step S515, control unit 29 can determine whether or not a signal transmitted from reader-writer 4 (specifically, a polling request frame) as a result of proximity between portable terminal 2 and reader-writer 4 has normally been received through NFC control unit 27 within a prescribed period (250 ms by way of example). When the signal has been received (YES in step S515), control unit 29 can communicate with reader-writer 4 by means of NFC control unit 27 (step S531). Specifically, NFC control unit 27 can generate an NFCID based on random numbers, have the NFCID included in the polling response frame, and transmit the polling response frame to reader-writer 4. Control unit 29 can control NFC control unit 27 and exchange data necessary for executing the card emulation function with reader-writer 4. When control unit 29 has not received the signal (NO in step S515), the process can proceed to step S501.

The above is the description of the procedure in the communication processing. How a state signal (SIG0), a count value of counter 25, an output voltage from DAC 122, and a resistance value of variable resistance 121 are varied when the communication processing described above is performed will now be described.

<5-2. Case that Communication is not Established>

Change in state signal when communication with neither of NFC tag 3 and reader-writer 4 is established, such as when portable terminal 2 is not proximate to NFC tag 3 and reader-writer 4, will be described with reference to FIG. 2. The abscissa in FIG. 2 represent time t.

NFC control unit 27 can repeat output of a signal ("Listen" of SIG0 in FIG. 2) at the L level indicating the passive mode for 250 ms and output of a signal ("Poll" of SIG0 in FIG. 2) at the H level indicating the active mode for 50 ms, as SIG0.

A counter count value represents a count value counted by counter 25 and output to DAC 122.

The counter count value has an initial value of 0 and is counted up one by one each time SIG0 makes transition from the L level to the H level. When SIG0 makes transition from the L level to the H level with the count value being set to 7, the count value returns to 0.

A DAC output voltage represents a voltage output from DAC 122 and varies in accordance with a counter count value. A DAC output voltage is defined, for example, as a count value×0.1 V.

A variable resistance value represents a resistance value of variable resistance 121 and varies in accordance with a DAC output voltage. The variable resistance value is defined, for example, as a DAC output voltage value× 1000Ω.

When communication is not carried out, a resistance value of variable resistance 121 repeats such change as increase from 0Ω to 700Ω in a step of 100Ω and return to 0Ω.

<5-3. Case that Communication with NFC Tag 3 is Established in Active Mode>

Change in state signal when communication between portable terminal 2 and NFC tag 3 is established will be described with reference to FIG. 3. A case that communication between portable terminal 2 and NFC tag 3 is not established when a variable resistance value is set to values other than 500Ω but is established when a variable resistance value is set to 500Ω with a gain of a received signal being set to an appropriate value will be described below by way of example.

FIG. 3 is different from FIG. 2 in that a counter count value is set to 5, that is, a variable resistance value is set to 500Ω. Namely, NFC control unit 27 of portable terminal 2 can maintain a level of SIG0 (the H level in the case of FIG. 3) while communication is established. In this case, a gain of a received signal can be kept at an appropriate value.

<5-4. Case that Communication with Reader-Writer 4 is Established in Passive Mode>

Change in state signal when communication between portable terminal 2 and reader-writer 4 is established will be described with reference to FIG. 4. A case that communication between portable terminal 2 and reader-writer 4 is not established when a variable resistance value is set to values other than 400Ω but is established when a variable resistance value is set to 400Ω with a gain of a received signal being set to an appropriate value will be described below by way of example.

FIG. 4 is different from FIG. 2 in that a counter count value is set to 4, that is, a variable resistance value is set to 400Ω. NFC control unit 27 of portable terminal 2 can maintain a level of SIG0 (the L level in the case of FIG. 4) while communication is established. In this case, a gain of a received signal can be kept at an appropriate value.

<6. Modification>

Though the communication system according to the first embodiment has been described above, the exemplified communication system can also be modified as below, and limitation to the communication system as shown in the first embodiment described above is naturally not intended.

In the first embodiment described above, signal SIG0 output from NFC control unit 27 has been input as an input signal to counter 25, however, limitation thereto is not intended. A pulse having a period equivalent to a period of transmission of a series of data or a period of reception of data over carrier waves should only be employed.

For example, a state signal set to a first level (for example, the H level) during a period in which each of portable terminal 2 and reader-writer 4 outputs carrier waves and set to a second level (for example, the L level) during a period in which neither of portable terminal 2 and NFC tag 3 outputs carrier waves may be input to counter 25.

Figure 6:
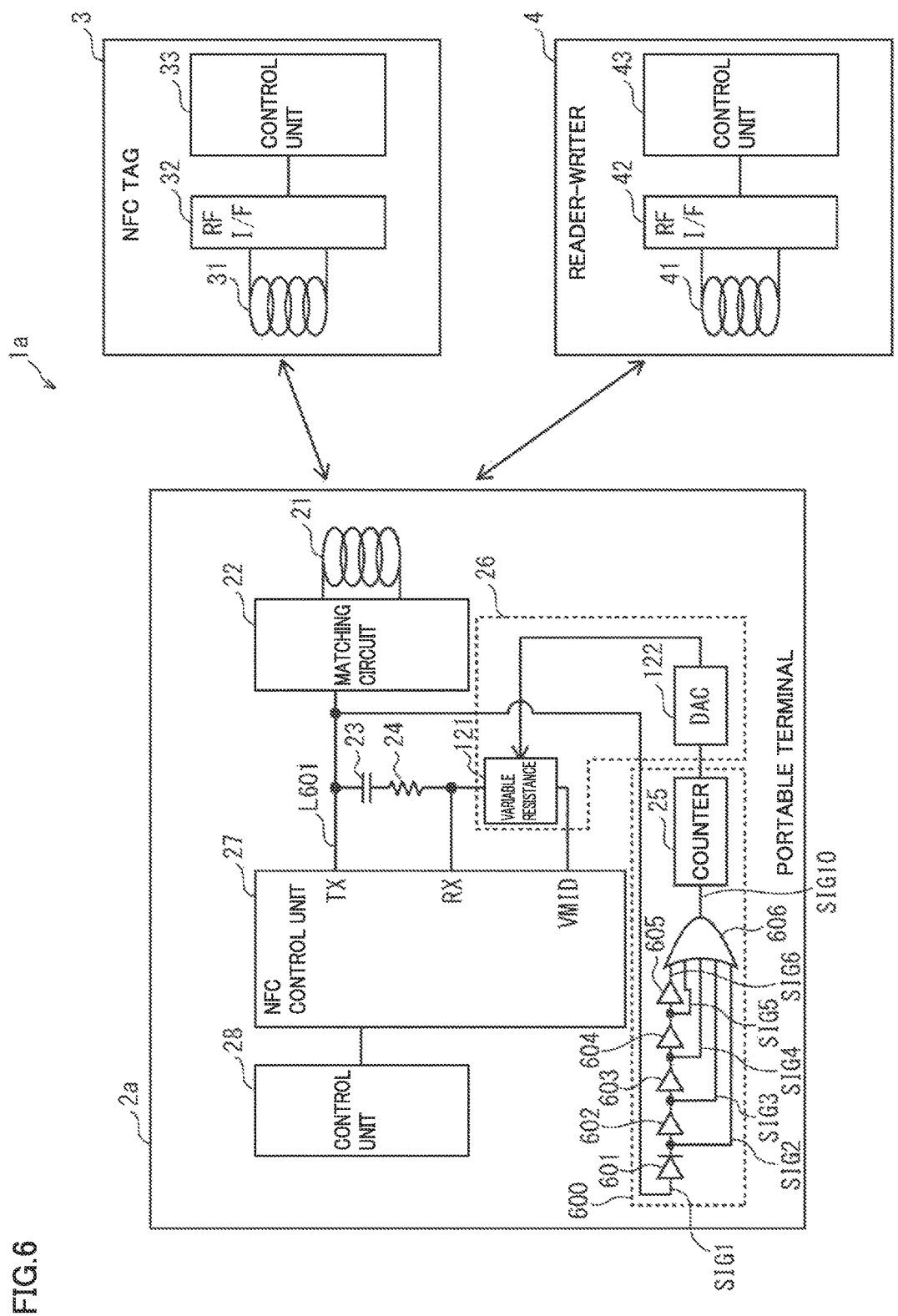
FIG. 6 is a block diagram showing a functional configuration of a communication system according to one modification of the first embodiment.

A communication system 1a according to the present modification will be described below with reference to FIGS. 6, 7A and 7B. Communication system 1a in FIG. 6 is different from communication system 1 in FIG. 1 in that a waveform shaping circuit 600 is added to the portable terminal and a signal SIG10 output from waveform shaping circuit 600 is input to counter 25.

(Waveform Shaping Circuit 600)

Waveform shaping circuit 600 can receive as an input, a signal which appears on a signal line L601 between terminal TX and matching circuit 22. A waveform of a sinusoidal wave corresponding to carrier waves as shown with SIG1 in FIG. 7A appears on L601 when portable terminal 2 transmits carrier waves and portable terminal 2 receives carrier waves from reader-writer 4.

Figure 7A:
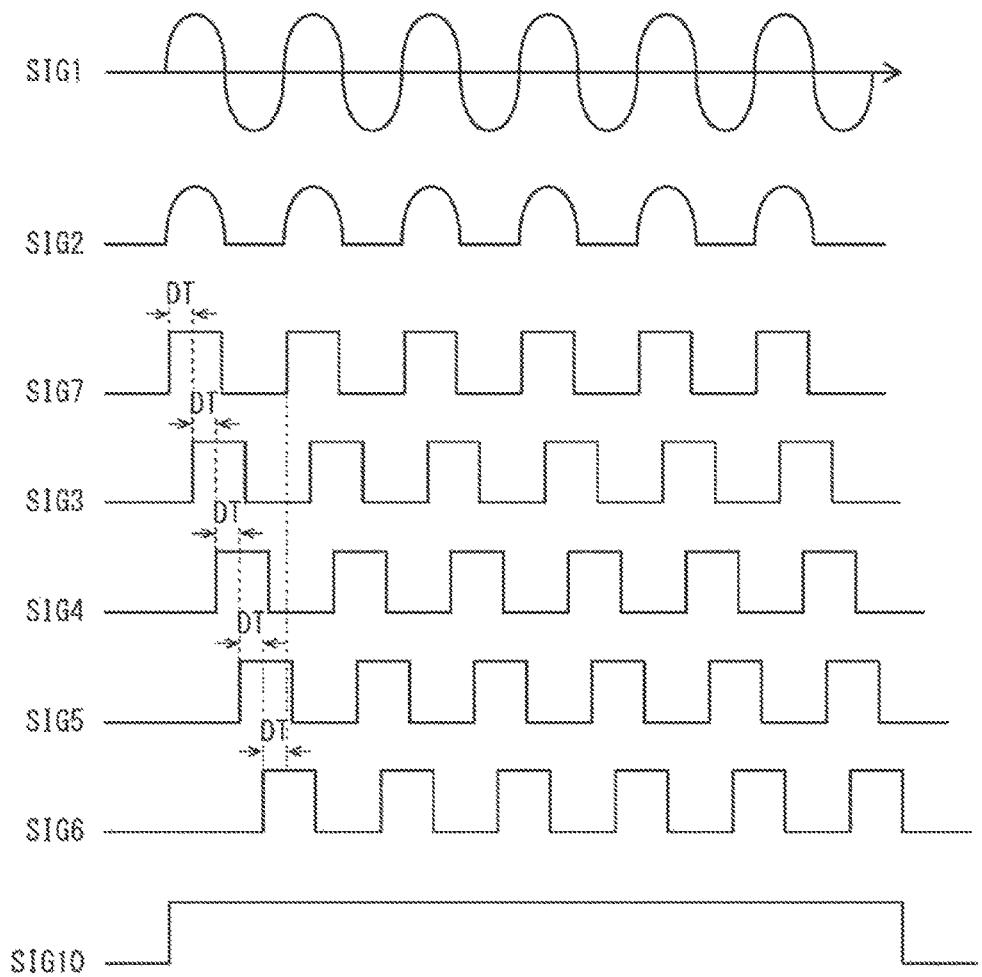
FIG. 7A is a diagram showing one example of a signal generated in each element when a waveform shaping circuit generates a state signal according to one modification of the first embodiment.

Waveform shaping circuit 600 can include a function to output a waveform as shown with SIG10 in FIG. 7A, which attains to the H level while SIG1 is input and attains to the L level while SIG1 is not input.

As shown in FIG. 6, waveform shaping circuit 600 can be constituted of a diode 601, buffers 602 to 605 representing delay elements, and an OR element 606 which are connected in series.

Diode 601 can output SIG1, with a negative signal portion thereof being cut off. An output from diode 601 (SIG2 in FIG. 7A) is input to buffer 602 and OR element 606. In OR element 606 and buffer 602 a portion of SIG2 not lower than a prescribed threshold value is determined as the H level and a portion thereof lower than the threshold value is determined as the L level. Namely, when SIG2 is input, OR element 606 and buffer 602 perform an operation the same as an operation at the time when SIG7 is input.

Buffers 602 to 605 each can output a signal with delay of an input signal by a time period DT. Signals output from buffers 602 to 605 are as shown with SIG3 to SIG6 in FIG. 7A.

SIG2 to SIG6 which are outputs from diode 601 and buffers 602 to 605 are input to OR element 606. OR element 606 can output SIG10 which is a result of logical sum of SIG7 and SIG3 to SIG6.

As set forth above, when carrier waves are input, waveform shaping circuit 600 outputs signal SIG10 set to the H level only during a period in which carrier waves are input. (Signal which Appears on L601)

A portable terminal 2a according to the present modification can alternately repeat communication in the active mode and communication in the passive mode as in an embodiment described above.

When portable terminal 2a communicates in the active mode, it can output carrier waves. A signal output from NFC control unit 27 for transmitting carrier waves through antenna 21 appears on signal line L601 between terminal TX and matching circuit 22. A signal which appears on L601 is a signal having a waveform as shown with SIG1 in FIG. 7A by way of example.

When portable terminal 2a receives carrier waves transmitted from reader-writer 4 while it operates in the passive mode, a signal having a waveform in accordance with carrier waves received by antenna 21 appears on L601. A signal which appears on L601 also has a waveform the same as SIG1 in FIG. 7A. When portable terminal 2a is not proximate to reader-writer 4 and communication with reader-writer 4 is not established while portable terminal 2a operates in the passive mode, no signal appears on L601.

According to the definition under the specifications of ISO/IEC18092, in output of carrier waves from reader-writer 4, reader-writer 4 should transmit carrier waves after lapse of a prescribed period after end of output of carrier waves from portable terminal 2a. In addition, according to the definition under the specifications, when portable terminal 2a outputs carrier waves as well, similarly, the portable terminal should transmit carrier waves after lapse of a prescribed period after reader-writer 4 ends output of carrier waves. In such a case, no signal appears on L601 for a prescribed period.

From the foregoing, a signal in accordance with carrier waves can appear on L601 when any one of portable terminal 2a and reader-writer 4 outputs carrier waves. No signal appears on L601 during a prescribed period from end of output of carrier waves from portable terminal 2a until start of output of carrier waves from reader-writer 4 and a prescribed period from end of output of carrier waves from reader-writer 4 until start of output of carrier waves from portable terminal 2a.

(Signal Output from Waveform Shaping Circuit 600 (Signal Input to Counter 25))

A signal output from waveform shaping circuit 600 and input to counter 25 when portable terminal 2a alternately communicates in the active mode and the passive mode will be described with reference to FIG. 7B.

(A) Initially, portable terminal 2a can output carrier waves in the active mode. Waveform shaping circuit 600 can output a signal at the H level while the active mode is set. This signal corresponds to a signal 710 in FIG. 7B. Carrier waves are actually modulated based on transmission data.

(B) Then, portable terminal 2a can communicate in the passive mode. Communication between portable terminal 2a and reader-writer 4 is not established. Portable terminal 2a does not receive carrier waves. Therefore, waveform shaping circuit 600 can output a signal at the L level while the passive mode is set. This signal corresponds to a signal 711 in FIG. 7B.

(C) Then, portable terminal 2a can output carrier waves in the active mode. Here, a signal having a waveform in accordance with carrier waves appears on L601. Waveform shaping circuit 600 can output a signal at the H level while the active mode is set. This signal corresponds to a signal 712 in FIG. 7B.

(D) Then, portable terminal 2a can communicate in the passive mode. Here, communication between portable terminal 2a and reader-writer 4 is established. Reader-writer 4 does not transmit carrier waves for a prescribed period after end of transmission of carrier waves from portable terminal 2a. Therefore, waveform shaping circuit 600 can output a signal at the L level for the prescribed period. This signal corresponds to a signal 713 in FIG. 7B.

After lapse of the prescribed period, reader-writer 4 can transmit carrier waves and portable terminal 2a can receive the carrier waves. Here, a signal having a waveform in accordance with the carrier waves appears on L601. Waveform shaping circuit 600 can output a signal at the H level while the passive mode is set. This signal corresponds to a signal 714 in FIG. 7B.

(E) Then, portable terminal 2a communicates in the active mode. In (D) described above, carrier waves are transmitted from reader-writer 4. Therefore, portable terminal 2a waits for lapse of the prescribed period after end of transmission of carrier waves from reader-writer 4. Here, no signal appears on L601. Waveform shaping circuit 600 can output a signal at the L level for the prescribed period. This signal corresponds to a signal 715 in FIG. 7B.

Since portable terminal 2a communicates in the active mode, it can output carrier waves. Here, a signal having a waveform in accordance with the carrier waves appears on L601. Waveform shaping circuit 600 can output a signal at the H level while the active mode is set. This signal corresponds to a signal 716 in FIG. 7B.

Figure 7B:
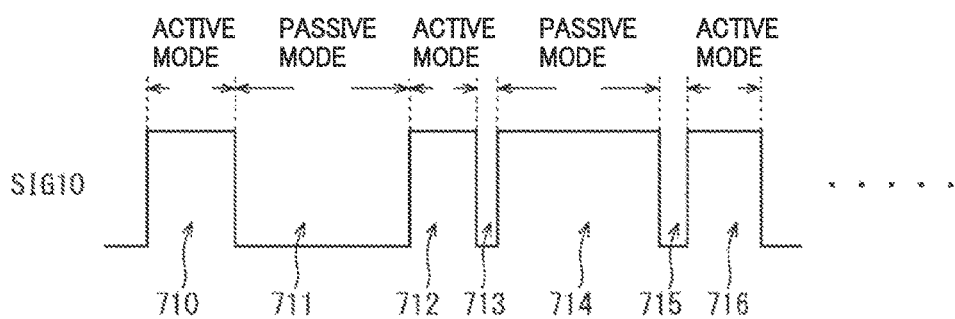
FIG. 7B is a diagram showing one example of a signal input to a counter according to one modification of the first embodiment.

As set forth above, a pulse signal set to the H level only during a period in which any of portable terminal 2a and reader-writer 4 outputs carrier waves as shown with SIG10 in FIG. 7B is input to counter 25. Operations of counter 25, DAC 122, and variable resistance 121 at the time when counter 25 accepts such a pulse signal are the same as in the first embodiment described above.

[Second Embodiment]

<1. Overview>

A portable terminal can communicate in the active mode when it executes the reader-writer function. In communication in the active mode, the portable terminal can transmit and receive data to and from a contactless IC card (an NFC tag by way of example) by outputting carrier waves from the portable terminal itself. Specifically, the portable terminal can generate magnetic field by feeding a current to a loop antenna. The contactless IC card can generate a current by receiving magnetic field at its own loop antenna and can obtain operating electric power from the generated current. Magnetic field which can be generated by the portable terminal is weaker as a distance from the loop antenna is greater. Therefore, intense magnetic field is required for transmitting carrier waves to a contactless IC card at a great distance and a high current is required for generating intense magnetic field.

A method called low power tag detect (LPTD) is available as measures for lowering current consumption in communication in the active mode. With this method, a portable terminal can output magnetic field only for a certain period such that a contactless IC card may come close at any time, and can stop output of magnetic field during other periods. Current consumption during polling processing, that is, during stand-by, is thus lowered.

When communication with a contactless IC card is started, the portable terminal should always generate magnetic field. The portable terminal feeds a high current so as to be able to communicate with the contactless IC card which is a communication counterpart even though it is distant from the portable terminal. When the contactless IC card is close to the portable terminal, however, a current uselessly high relative to magnitude of required magnetic field is fed.

In a second embodiment, a portable terminal capable of achieving lowering in current consumption in communication in the active mode will be described.

A communication system 1b according to the second embodiment will be described below with reference to FIG. 8. Communication system 1b according to the second embodiment is different from communication system 1 in FIG. 1 in including a portable terminal 2b instead of portable terminal 2.

<2. Portable Terminal 2b>

Portable terminal 2b is represented by a smartphone by way of example. Portable terminal 2b includes the reader-writer function and the card emulation function similarly to portable terminal 2. Portable terminal 2b can alternately repeat execution of the reader-writer function and execution of the card emulation function. For example, portable terminal 2b can execute the reader-writer function for 50 ms and can execute the card emulation function for 250 ms. When communication with NFC tag 3 is established while portable terminal 2b executes the reader-writer function, portable terminal 2b can continue execution of the reader-writer function until a series of communication processes ends even after lapse of 50 ms. In the second embodiment, a case that portable terminal 2b executes the reader-writer function and communicates with NFC tag 3 will be described.

<2-1. Configuration>

Portable terminal 2b is basically the same in configuration as portable terminal 2. Portable terminal 2b includes as a main functional configuration, antenna 21, matching circuit 22, NFC control unit 27, a control unit 29b, and a variable resistance 123, as shown in FIG. 8.

Antenna (loop antenna) 21 is implemented by a coil obtained by annularly forming a conductor. Matching circuit 22 can be implemented by combination of an inductor element and a capacitor element. Matching circuit 22 can match an impedance between antenna 21 and a circuit implementing portable terminal 2b.

NFC control unit 27 is implemented by a control IC for near field radio communication with NFC tag 3 through antenna 21. NFC control unit 27 includes an oscillator 271, a modulation circuit 272, a power amplifier 273, and terminal TX as a configuration for communication in the active mode. Terminal TX is an output terminal outputting a signal for transmitting data to antenna 21.

Oscillator 271 can generate carrier waves. A frequency of the carrier waves is set to 13.56 MHz by way of example and a rate of communication is set to 212 kbps. Modulation circuit 272 can modulate carrier waves generated by oscillator 271 under the ASK 10% scheme based on transmission data subjected to Manchester coding. Power amplifier 273 can amplify the modulated carrier waves. The amplified carrier waves can be output from terminal TX to antenna 21.

Variable resistance 123 can be provided between matching circuit 22 and antenna 21. Variable resistance 123 is implemented by a variable resistor of which resistance value is varied in accordance with a control signal input from control unit 29b. Specifically, when the control signal is set to the H level (first level), variable resistance 123 has a resistance value Ra (a first resistance value). When the control signal is set to the L level (second level), variable resistance 123 has a resistance value Rb (a second resistance value). Resistance value Ra is set, for example, to 0Ω. Resistance value Rb is greater than resistance value Ra and it is set, for example, to approximately 1 to 2Ω.

Variable resistance 123 is configured such that a resistance value thereof can be switched between two resistance values Ra and Rb (>Ra) in accordance with a control signal from control unit 29b. By switching between the resistance values of variable resistance 123, magnitude of a current which flows to antenna 21 varies. Thus, magnitude of magnetic field generated in antenna 21, that is, intensity of carrier waves, can vary.

Control unit 29b can include at least one processor and a memory and can have a function to control overall operations of portable terminal 2b. Each function of control unit 29b is implemented by execution of a program stored in a memory by at least one processor. Control unit 29b can have a function for control for implementing the reader-writer function in portable terminal 2b described above.

NFC control unit 27 corresponds to one embodiment of the "communication unit" and control unit 29b and variable resistance 123 correspond to one embodiment of the "intensity change unit" which changes intensity of carrier waves transmitted from antenna 21.

<2-2. Communication Control Function of NFC Control Unit 27>

Figure 9:
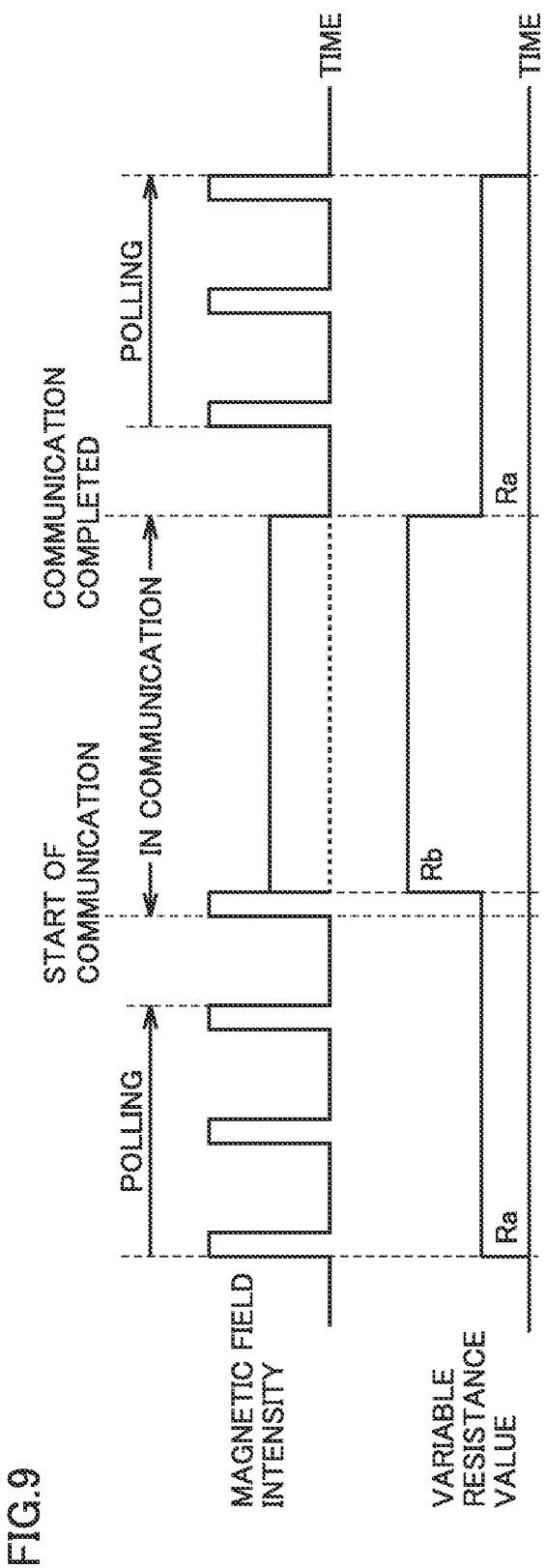
FIG. 9 is a timing chart of intensity of carrier waves and a variable resistance value when communication with an NFC tag is established.
Figure 10:
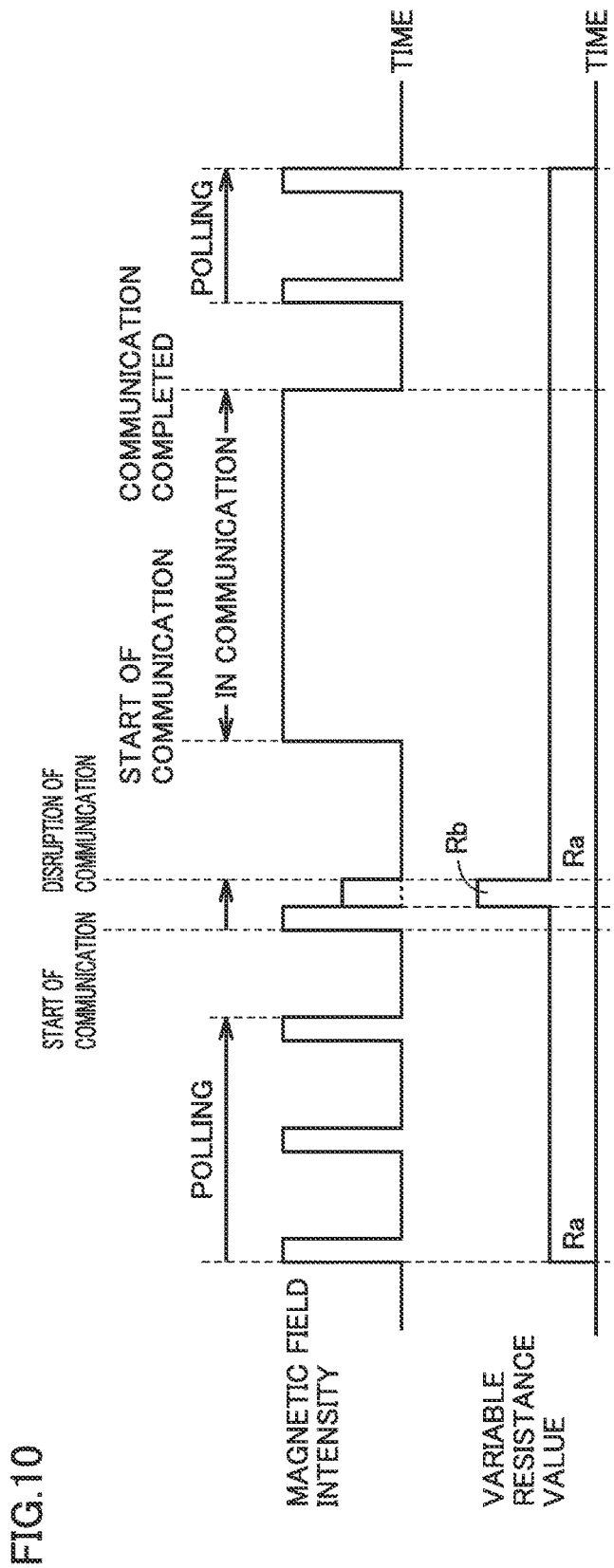
FIG. 10 is a timing chart of intensity of carrier waves and a variable resistance value when communication with an NFC tag is disrupted.

The communication function in the active mode of NFC control unit 27 will be described below. How magnitude of magnetic field generated in antenna 21 (intensity of carrier waves) and a resistance value of variable resistance 123 change when portable terminal 2b communicates with NFC tag 3 will be described with reference to FIGS. 9 and 10. The abscissa in FIGS. 9 and 10 represents time.

(1) Case that Communication with NFC Tag 3 is Established

Change in intensity of carrier waves and resistance value of variable resistance 123 when communication with NFC tag 3 is established such as when portable terminal 2b is proximate to NFC tag 3 will be described with reference to FIG. 9.

When the communication mode is switched to the active mode, portable terminal 2b initially can start polling processing for identifying a communication counterpart which is present in the surroundings. In polling processing, portable terminal 2b can transmit a polling request frame.

In the polling processing, NFC control unit 27 can subject transmission data designated by control unit 29b to Manchester coding and output carrier waves as being modulated under the ASK 10% scheme based on the coded transmission data. After transmission of the transmission data, NFC control unit 27 can continue to output a signal for a prescribed period (50 ms by way of example). The carrier waves are thus transmitted from antenna 21.

During the polling processing, control unit 29b can output a control signal at the H level to variable resistance 123. A resistance value of variable resistance 123 is set to Ra (0Ω by way of example) in response to reception of the control signal at the H level. A value of a current which flows through antenna 21 while variable resistance 123 has resistance value Ra is denoted as Ia.

During polling processing, control unit 29b can determine whether or not a reply has been given from NFC tag 3. Whether or not a reply has been given can be determined based on whether or not NFC control unit 27 can normally receive a polling response frame from NFC tag 3 within a prescribed period (50 ms). When a reply has been given within the prescribed period, control unit 29b can communicate with NFC tag 3 by means of NFC control unit 27.

When communication with NFC tag 3 is established, control unit 29b can output the control signal with its level being switched from the H level to the L level. A resistance value of variable resistance 123 is thus switched from Ra (0Ω by way of example) to Rb (1 to 2Ω by way of example). With increase in resistance value of variable resistance 123, a value of a current which flows in antenna 21 is smaller. Namely, with a value of a current which flows to antenna 21 while variable resistance 123 has resistance value Rb being denoted as Ib, relation of Ia>Ib is satisfied. Consequently, magnetic field generated in antenna 21 after start of communication is lower in magnitude than magnetic field generated during polling processing.

As shown in FIG. 9, control unit 29b can maintain a resistance value of variable resistance 123 at Rb while communication with NFC tag 3 is established. A value of a current which flows in antenna 21 during communication is thus maintained at Ib. When communication is completed, NFC control unit 27 can resume polling processing. Control unit 29b can output the control signal with its level being switched from the L level to the H level after completion of communication. Since a resistance value of variable resistance 123 thus returns to Ra, a value of a current which flows in antenna 21 also returns to Ia.

Thus, during polling processing, portable terminal 2b according to the second embodiment can generate intense magnetic field by feeding a high current to antenna 21 for identifying a communication counterpart which is present in the surroundings. When a communication counterpart is identified as NFC tag 3 is proximate, portable terminal 2b can start communication with NFC tag 3 which is a communication counterpart, with a current fed to antenna 21 being lowered than in the polling processing (that is, with intensity of magnetic field being lowered). When communication with NFC tag 3 is established while intensity of magnetic field generated in antenna 21 is lowered after start of communication, portable terminal 2b can maintain a current fed to antenna 21 at a low current value until communication is completed. By thus switching a current fed to antenna 21 from a current value necessary for polling processing to a current value allowing communication to be maintained, current consumption during communication by portable terminal 2b can be lowered.

(2) Case that Communication with NFC Tag 3 is Disrupted

When communication is started with a current fed to antenna 21 being lowered as above, intensity of magnetic field generated from antenna 21 is lower and communication may be disrupted owing to a greater distance between portable terminal 2b and NFC tag 3 during communication. Change in intensity of carrier waves and resistance value of variable resistance 123 at the time when communication between portable terminal 2b and NFC tag 3 is disrupted will be described with reference to FIG. 10.

When communication with NFC tag 3 is disrupted with a resistance value of variable resistance 123 having been switched to Rb after start of communication, control unit 29b can switch a resistance value of variable resistance 123 from Rb to Ra by switching the control signal from the L level to the H level. NFC control unit 27 can perform polling processing again. Since a current having current value Ia flows in antenna 21 during polling processing, magnetic field generated from antenna 21 is higher in intensity than magnetic field during communication. When communication with NFC tag 3 is established again, control unit 29b can maintain a resistance value of variable resistance 123 at Ra while communication with NFC tag 3 is established. Therefore, a value of a current which flows in antenna 21 during communication is maintained at Ia. When communication is completed, NFC control unit 27 can resume polling processing. Since control unit 29a continues to output a control signal at the H level also after completion of communication, a resistance value of variable resistance 123 is maintained at Ra while polling processing is performed.

As set forth above, when communication with NFC tag 3 is disrupted due to lowering in current fed to antenna 21, communication with NFC tag 3 can be established again by having the current return to original magnitude. Thus, current consumption during communication can be lowered within a range allowing ensured communication with NFC tag 3.

Though a resistance value of variable resistance 123 is switched between two resistance values Ra and Rb in the second embodiment, limitation thereto is not intended and a resistance value of variable resistance 123 may be switched among three or more resistance values. For example, when communication is disrupted due to change in resistance value of variable resistance 123 from Ra to Rb after start of communication, a resistance value of variable resistance 123 may be lowered stepwise from Rb toward Ra during polling processing. In this case, polling processing is performed while a resistance value of variable resistance 123 is being lowered, and a resistance value of variable resistance 123 is set to a value at the time when communication with NFC tag 3 is finally established. Consequently, a current fed to antenna 21 can be adjusted to a minimum current value at which communication with NFC tag 3 can be maintained, which contributes to lowering in current consumption during communication. In contrast, it may take time until communication with NFC tag 3 is established again after disruption of communication.

With such a configuration that a resistance value of variable resistance 123 is switched between two values as in the second embodiment above, communication with NFC tag 3 can be established again in a short period of time after disruption of communication. Therefore, the second embodiment is preferred as it can achieve both of improvement in rate of communication and lowering in current consumption.

3. Operations>
<3-1. Procedure in Communication Processing

A procedure in communication processing in communication system 1b configured as above will be described with reference to FIG. 12, with processing in portable terminal 2b being focused on.

Definition of a status indicating a state of communication of portable terminal 2b will initially be described with reference to FIG. 11. By way of example, a status is set to two patterns of "0" and "1". When the status is set to "0", a resistance value of variable resistance 123 is set to Ra during polling processing and a resistance value of variable resistance 123 is set to Rb during communication. Namely, when the status is set to "0", a resistance value of variable resistance 123 is increased from Ra to Rb with start of communication.

In contrast, when the status is set to "1", a resistance value of variable resistance 123 is set to Ra during polling processing and a resistance value of variable resistance 123 is set to Ra also during communication. Namely, when the status is set to "1", a resistance value of variable resistance 123 is maintained at Ra even after communication is started. Control unit 29b can set the status to any of "0" and "1" in accordance with a state of communication in NFC control unit 27.

Figure 12:
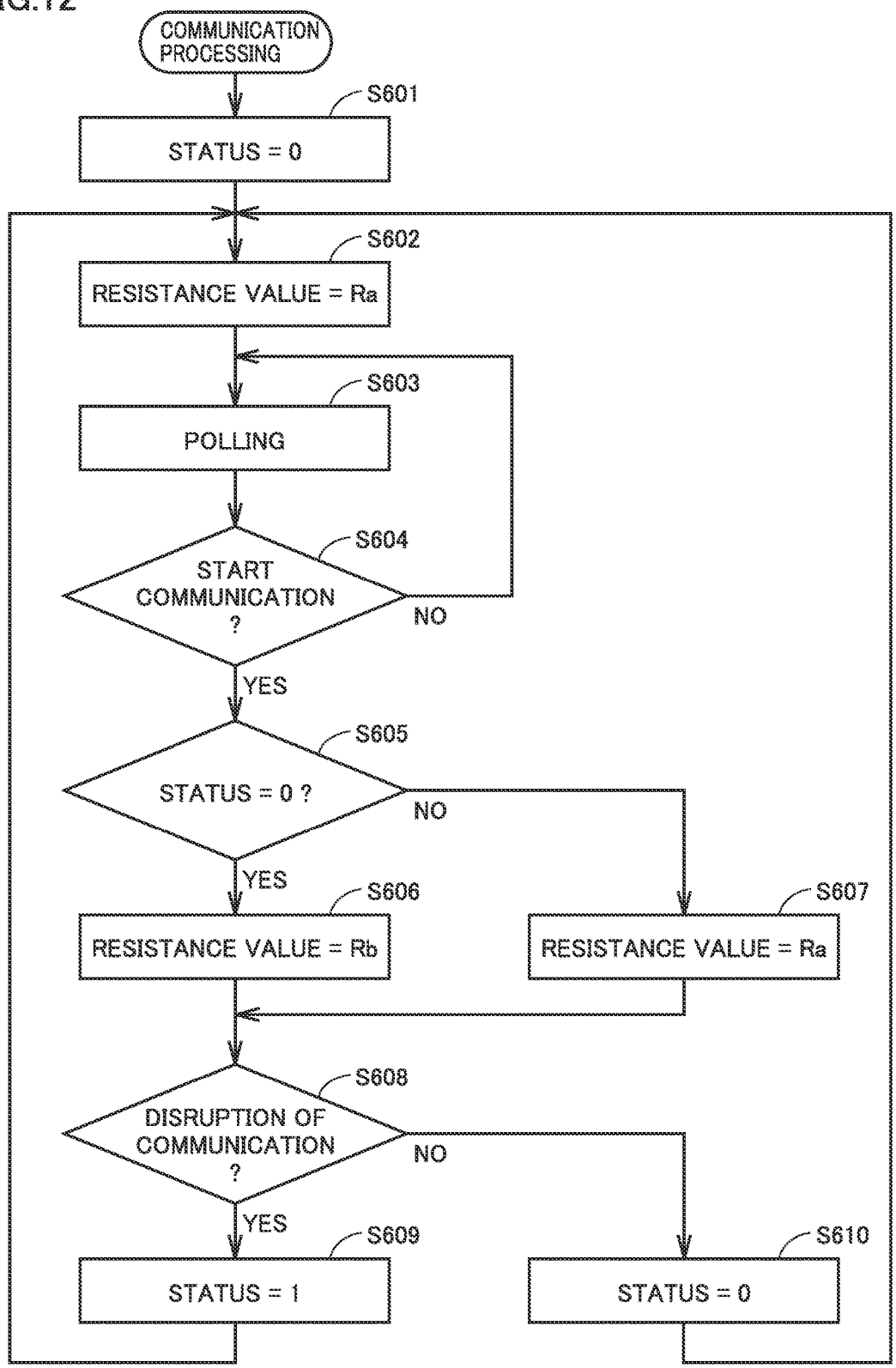
FIG. 12 is a flowchart showing a procedure in communication processing in the communication system according to the second embodiment.

Referring to FIG. 12, when communication processing is started, portable terminal 2b can initially perform polling processing for identifying a communication counterpart which is present in the surroundings. In step S601, control unit 29b can set a status to "0". In step S602, control unit 29b can set a resistance value of variable resistance 123 to Ra by outputting a control signal at the H level to variable resistance 123. In step S603, NFC control unit 27 can start polling processing. NFC control unit 27 can transmit a polling request frame.

In step S604, control unit 29b can determine whether or not communication with NFC tag 3 has been started based on a reply given from NFC tag 3 within a prescribed period. When a polling response frame could not normally be received from NFC tag 3 within the prescribed period, control unit 29b determines that communication with NFC tag 3 has not been started (determination as NO in step S604), and the process returns to step S603, in which polling processing can be continued.

When it is determined that communication with NFC tag 3 has been started (determination as YES in step S604), control unit 29b can determine in step S605 whether or not the status has been set to "0". When the status has been set to "0" (determination as YES in step S605), the process proceeds to step S606 and control unit 29b can set a resistance value of variable resistance 123 to Rb by outputting a control signal at the L level to variable resistance 123. Thus, a value of a current which flows in antenna 21 after start of communication with NFC tag 3 is set to Ib.

When the status has not been set to "0", that is, when the status has been set to "1" (determination as NO in step S605), the process proceeds to step S607 and control unit 29b can set a resistance value of variable resistance 123 to Ra by outputting a control signal at the H level to variable resistance 123. Thus, a value of a current which flows in antenna 21 after start of communication with NFC tag 3 is set to Ia.

In step S608, control unit 29b can determine whether or not communication with NFC tag 3 has been disrupted. When it is determined that communication with NFC tag 3 has been disrupted (determination as YES in step S608), control unit 29b can set the status to "1" in step S609 and the process can return to step S602. Thus, polling processing can be performed again with a resistance value of variable resistance 123 being set to Ra. When communication with NFC tag 3 is established again and communication is started with the status being set to "1", a value of a current which flows in antenna 21 is set to Ia.

When it is determined in step S608 that communication with NFC tag 3 has not been disrupted (determination as NO in step S608), control unit 29b can set the status to "0" in step S610 in response to successful completion of communication with NFC tag 3. Thereafter, the process returns to step S602, so that polling processing can be performed again with a resistance value of variable resistance 123 being set to Ra.

<4. Modification>

In the second embodiment, a value of a current which flows in antenna 21 is varied by varying a resistance value of variable resistance 123 connected between matching circuit 22 and antenna 21. A value of a current which flows in antenna 21 may be varied by varying magnitude of carrier waves output from NFC control unit 27.

Figure 13:
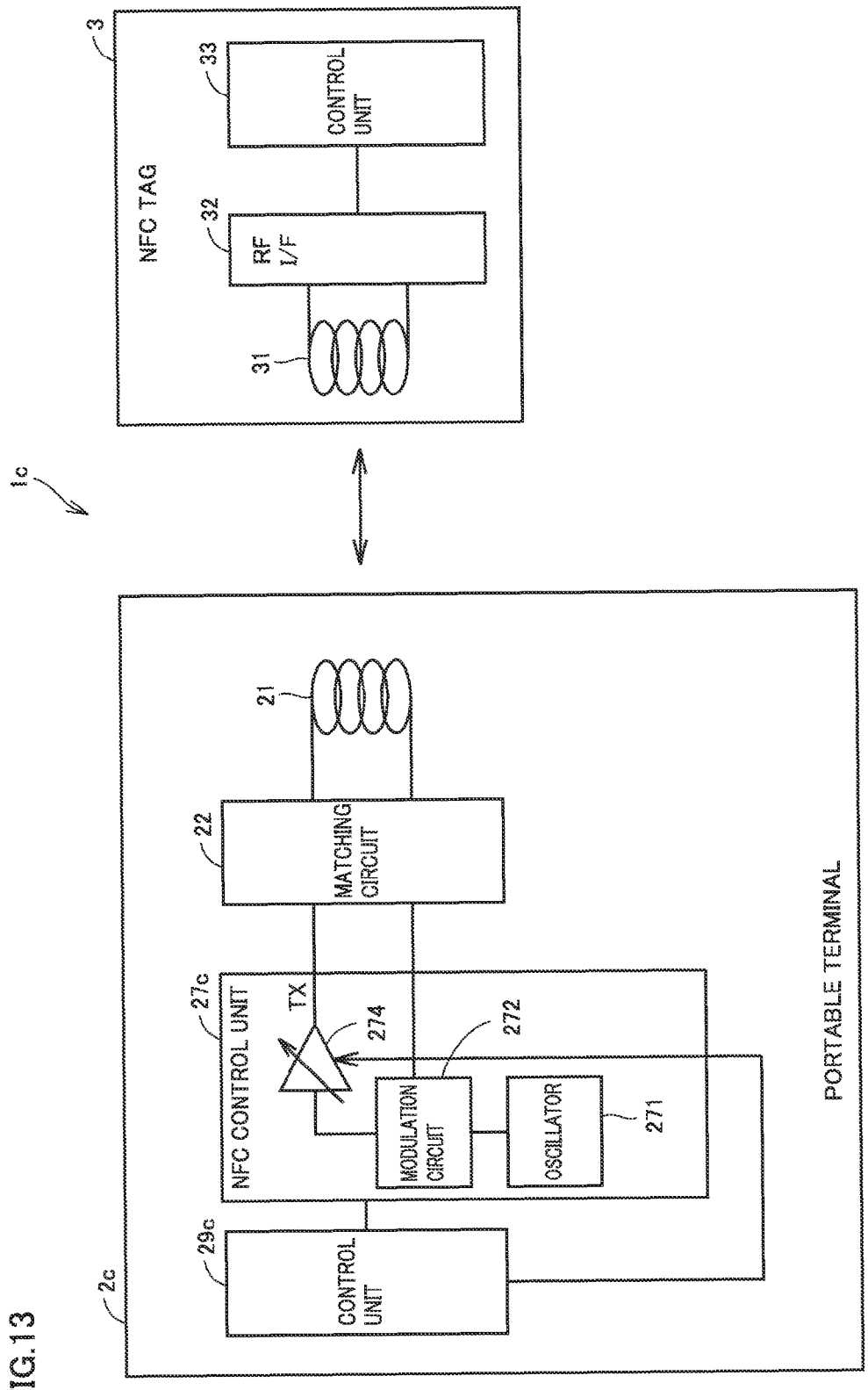
FIG. 13 is a block diagram showing a functional configuration of a communication system according to one modification of the second embodiment.

A communication system 1c according to a modification of the second embodiment will be described below with reference to FIGS. 13 to 16. Communication system 1c in FIG. 13 is different from communication system 1b in FIG. 8 in that a variable gain amplifier (VGA) 274 instead of power amplifier 273 is provided in an NFC control unit 27c of a portable terminal 2c.

(Variable Gain Amplifier 274)

Variable gain amplifier 274 can amplify carrier waves modulated by modulation circuit 272. Variable gain amplifier 274 is configured to be able to vary a gain value in accordance with a control signal input from a control unit 29c. Specifically, when a control signal is at the H level (first level), variable gain amplifier 274 has a gain value Ga (a first gain value). When a control signal is at the L level (second level), variable gain amplifier 274 has a gain value Gb (a second gain value). Gain value Gb is smaller than gain value Ga. Namely, variable gain amplifier 274 is configured such that a gain value thereof can be switched between two gain values Ga and Gb (<Ga) in accordance with a control signal from control unit 29c. Then, magnitude of a current which flows in antenna 21 varies by switching between gain values of variable gain amplifier 274. Magnitude of magnetic field generated in antenna 21, that is, intensity of carrier waves, is thus varied.

Control unit 29c includes at least one processor and a memory and controls overall operations of portable terminal 2c. Each function of control unit 28c is implemented by execution of a program stored in a memory by at least one processor. Control unit 29c can have a function for control for implementing the reader-writer function in portable terminal 2c.

NFC control unit 27 corresponds to one embodiment of the "communication unit" and control unit 29c and variable gain amplifier 274 correspond to one embodiment of the "intensity change unit."

<4-1. Communication Control Function of NFC Control Unit 27>

Figure 14:
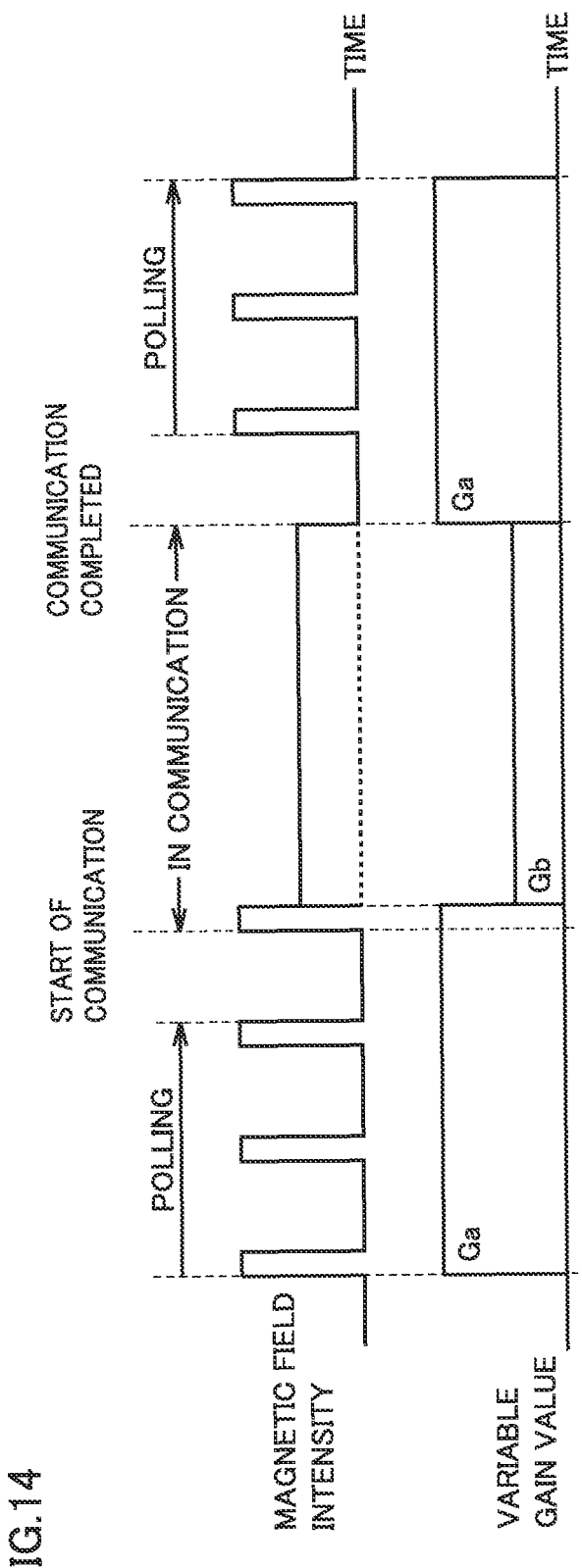
FIG. 14 is a timing chart of intensity of carrier waves and a variable gain value when communication with an NFC tag is established.
Figure 15:
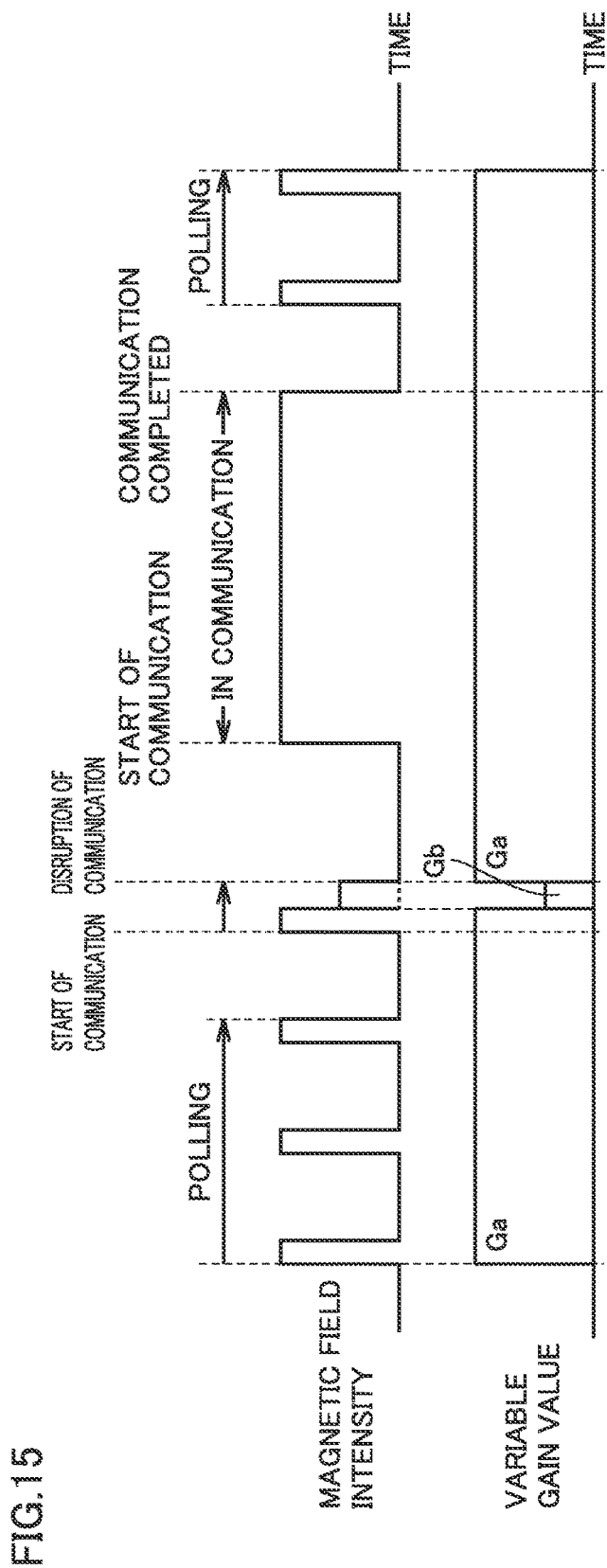
FIG. 15 is a timing chart of intensity of carrier waves and a variable gain value when communication with an NFC tag is disrupted.

The communication function in the active mode of NFC control unit 27 will be described below. How magnitude of magnetic field generated in antenna 21 (intensity of carrier waves) and a gain value of variable gain amplifier 274 change when portable terminal 2c communicates with NFC tag 3 will be described with reference to FIGS. 14 and 15. The abscissa in FIGS. 14 and 15 represents time.

(1) Case that Communication with NFC Tag 3 is Established

Change in intensity of carrier waves and gain value of variable gain amplifier 274 when communication with NFC tag 3 is established such as when portable terminal 2c is proximate to NFC tag 3 will be described with reference to FIG. 14.

When the communication mode is switched to the active mode, portable terminal 2c initially can start polling processing. In polling processing, NFC control unit 27c can subject transmission data designated by control unit 27c to Manchester coding and output carrier waves as being modulated under the ASK 10% scheme based on the coded transmission data. After transmission of the transmission data, NFC control unit 27c can continue to output a signal for a prescribed period (50 ms by way of example). The carrier waves are thus transmitted from antenna 21.

During the polling processing, control unit 29c can output a control signal at the H level to variable gain amplifier 274. A gain value of variable gain amplifier 274 is set to Ga in response to reception of the control signal at the H level. A value of a current which flows through antenna 21 while variable gain amplifier 274 has gain value Ga is denoted as Ia.

During the polling processing, control unit 29c can determine whether or not a reply has been given from NFC tag 3. Whether or not a reply has been given can be determined based on whether or not NFC control unit 27c can normally receive a polling response frame from NFC tag 3 within a prescribed period (50 ms). When a reply has been given within a prescribed period, control unit 29c can communicate with NFC tag 3 by means of NFC control unit 27c.

When communication with NFC tag 3 is established, control unit 29c can output the control signal with its level being switched from the H level to the L level. A gain value of variable gain amplifier 274 is thus switched from Ga to Gb. With decrease in gain value of variable gain amplifier 274, magnitude of carrier waves output from NFC control unit 27c is lower and hence a value of a current which flows in antenna 21 is smaller. Namely, with a value of a current which flows to antenna 21 while variable gain amplifier 274 has gain value Gb being denoted as Ib, relation of Ia>Ib is satisfied. Consequently, magnetic field generated in antenna 21 after start of communication can be lower in magnitude than magnetic field generated during polling processing.

As shown in FIG. 14, control unit 29c can maintain a gain value of variable gain amplifier 274 at Gb while communication with NFC tag 3 is established. A value of a current which flows in antenna 21 during communication is thus maintained at Ib. When communication is completed, NFC control unit 27c can resume polling processing. Control unit 29c can output the control signal with its level being switched from the L level to the H level after completion of communication. Since a gain value of variable gain amplifier 274 thus returns to Ga, a value of a current which flows in antenna 21 can also returns to Ia.

(2) Case that Communication with NFC Tag 3 is Disrupted

Change in intensity of carrier waves and gain value of variable gain amplifier 274 at the time when communication between portable terminal 2c and NFC tag 3 is disrupted will be described with reference to FIG. 15.

When communication with NFC tag 3 is disrupted with a gain value of variable gain amplifier 274 having been switched to Gb after start of communication, control unit 29c can switch a gain value of variable gain amplifier 274 from Gb to Ga by switching the control signal from the L level to the H level. NFC control unit 27c can perform polling processing again. Since a current having current value Ia flows in antenna 21 during polling processing, magnetic field generated from antenna 21 can be higher in intensity than magnetic field during communication. When communication with NFC tag 3 is established again, control unit 29c can maintain a gain value of variable gain amplifier 274 at Ga while communication with NFC tag 3 is established. Therefore, a value of a current which flows in antenna 21 during communication is maintained at Ia. When communication is completed, NFC control unit 27c can resume polling processing. Since control unit 29a can continue to output a control signal at the H level also after completion of communication, a gain value of variable gain amplifier 274 is maintained at Ga during polling processing.

<4-2. Operations>

<4-2-1. Procedure in Communication Processing>

Figure 16:
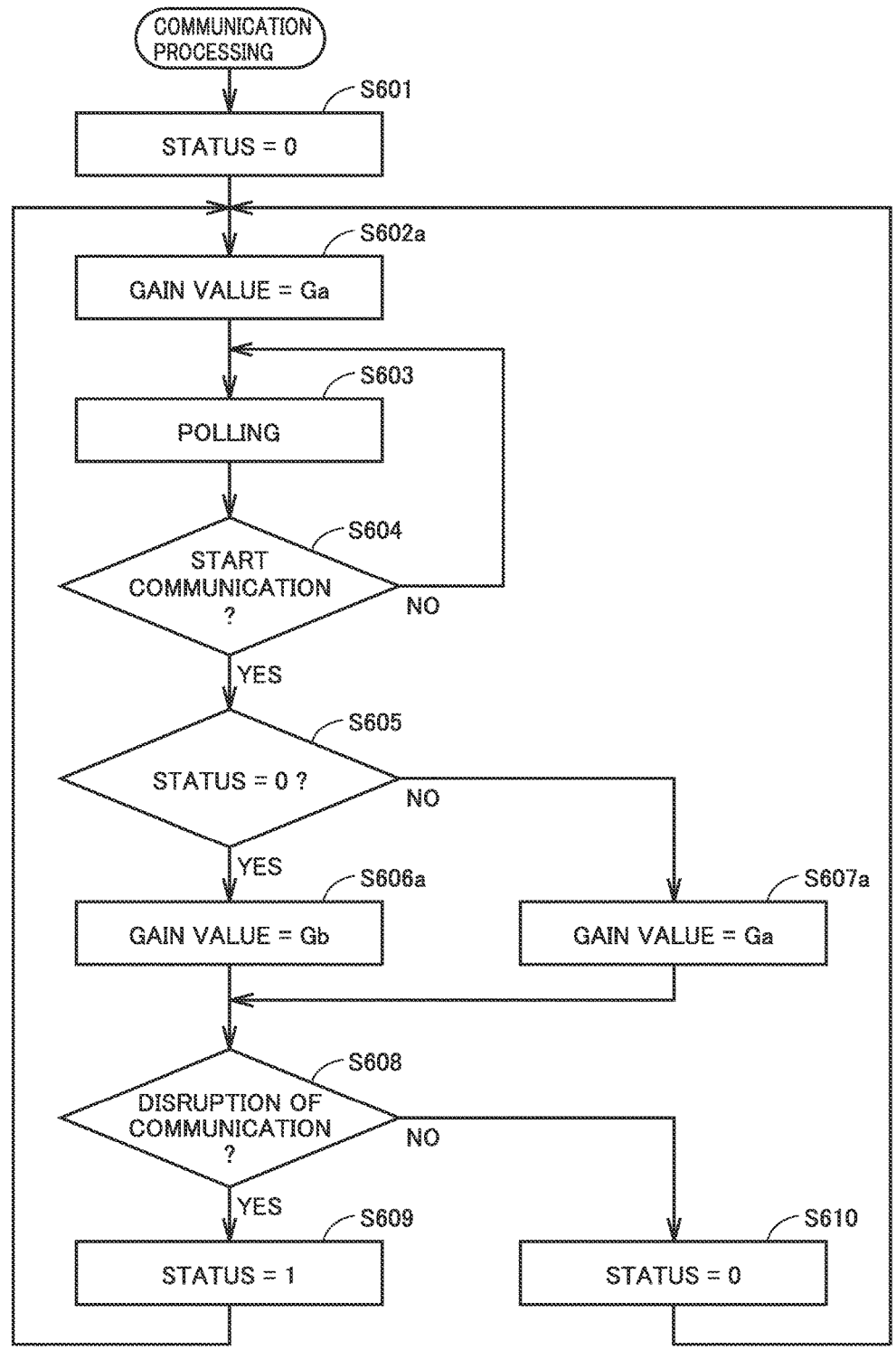
FIG. 16 is a flowchart showing a procedure in communication processing in the communication system according to one modification of the second embodiment.

A procedure in communication processing in communication system 1c configured as above will be described with reference to FIG. 16, with processing in portable terminal 2c being focused on.

In communication system 1c according to the present modification as well, a status indicating a state of communication of portable terminal 2c can be set to two patterns of "0" and "1". When the status is set to "0", a gain value of variable gain amplifier 274 is set to Ga during polling processing and a gain value of variable gain amplifier 274 is set to Gb during communication. Namely, when the status is set to "0", a gain value of variable gain amplifier 274 can be decreased from Ga to Gb with start of communication.

In contrast, when the status is set to "1", a gain value of variable gain amplifier 274 is set to Ga during polling processing and a gain value of variable gain amplifier 274 is set to Ga also during communication. Namely, when the status is set to "1", a gain value of variable gain amplifier 274 can be maintained at Ga even after communication is started. Control unit 29c can set the status to any of "0" and "1" in accordance with a state of communication in NFC control unit 27c.

A procedure in communication processing in communication system 1c is basically similar to the procedure in the communication processing in communication system 1b shown in FIG. 12. The procedure in communication processing in FIG. 16 is different from the procedure in communication processing in FIG. 12 in having steps S602a, S606a, and S607a instead of steps S602, S606, and S607.

In step S602a, a gain value of variable gain amplifier 274 can be set to Ga as control unit 29c outputs a control signal at the H level to variable gain amplifier 274. When the status is set to "0" (determination as YES in step S605), in step S606a, control unit 29c can set a gain value of variable gain amplifier 274 to Gb by outputting a control signal at the L level to variable gain amplifier 274. A value of a current which flows to antenna 21 is thus set to Ib during communication with NFC tag 3.

When the status is not set to "0", that is, the status is set to "1" (determination as NO in step S605), in step S607a, control unit 29c can set a gain value of variable gain amplifier 274 to Ga by outputting a control signal at the H level to variable gain amplifier 274. Thus, a value of a current which flows in antenna 21 during communication with NFC tag 3 is set to Ia.

Figure 8:
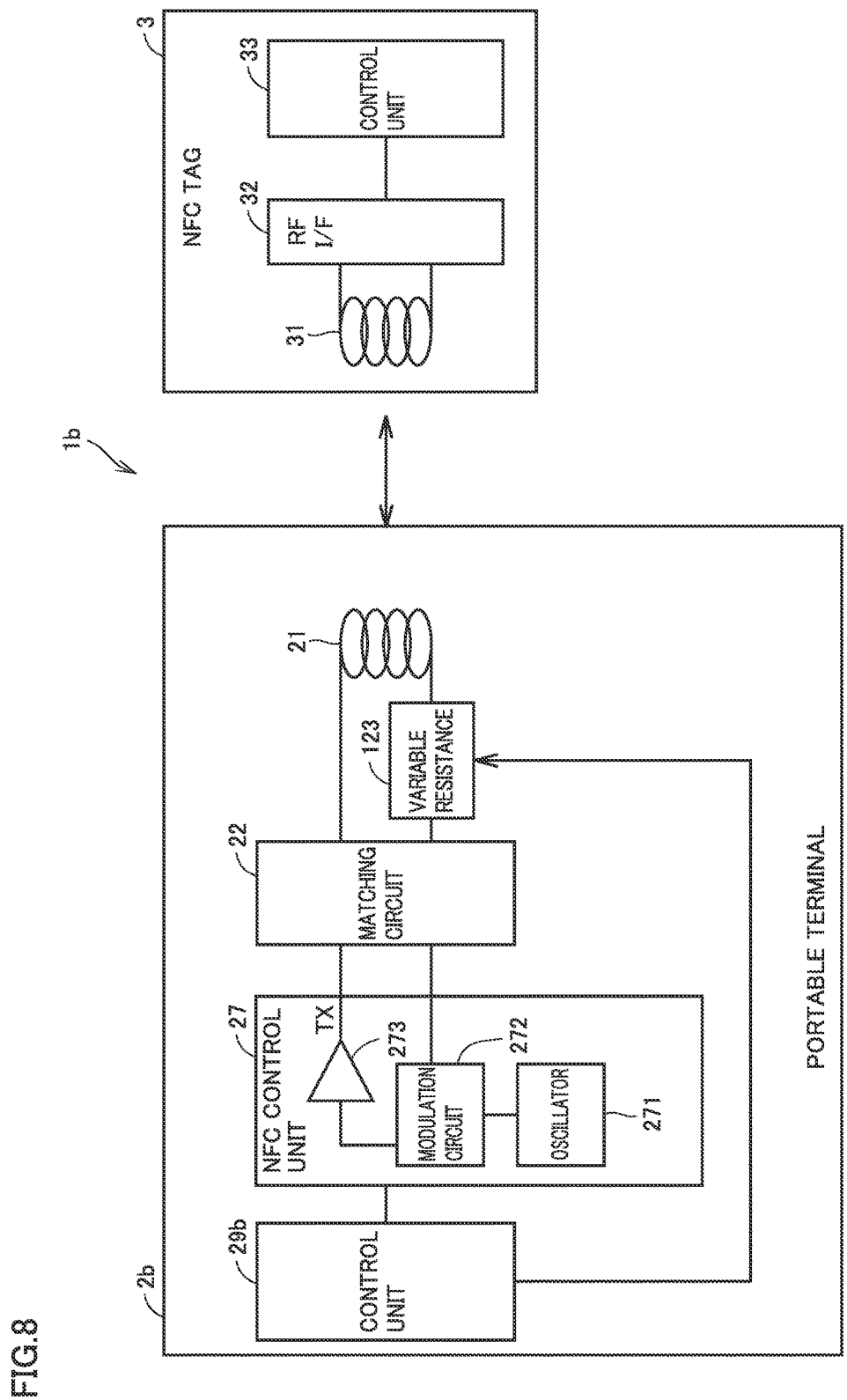
FIG. 8 is a block diagram showing a functional configuration of a communication system according to a second embodiment.

Thus, in portable terminal 2c according to the present modification as well, as in portable terminal 2b in FIG. 8, during polling processing, intense magnetic field can be generated by feeding a high current to antenna 21 for identifying a communication counterpart which is present in the surroundings. When a communication counterpart is identified as NFC tag 3 is proximate, portable terminal 2c can start communication with NFC tag 3 which is the communication counterpart, with a current fed to antenna 21 being lower than in polling processing. When communication with NFC tag 3 is established even though intensity of magnetic field generated by antenna 21 is lowered after start of communication, portable terminal 2c can maintain a current fed to antenna 21 at a small current value until communication is completed. By thus switching a current fed to antenna 21 from a current value necessary for polling processing to a current value allowing communication to be maintained, current consumption during communication in portable terminal 2c can be lowered.

When communication with NFC tag 3 is disrupted due to lowering in current fed to antenna 21, communication with NFC tag 3 can be established by having the current return to original magnitude. Consequently, current consumption during communication can be lowered within a range allowing ensured communication with NFC tag 3.

Though a gain value of variable gain amplifier 274 is switched between two gain values Ga and Gb in the present modification, limitation thereto is not intended and a gain value of variable gain amplifier 274 may be switched among three or more gain values.

[Third Embodiment]
<1. Overview>

Figure 17:
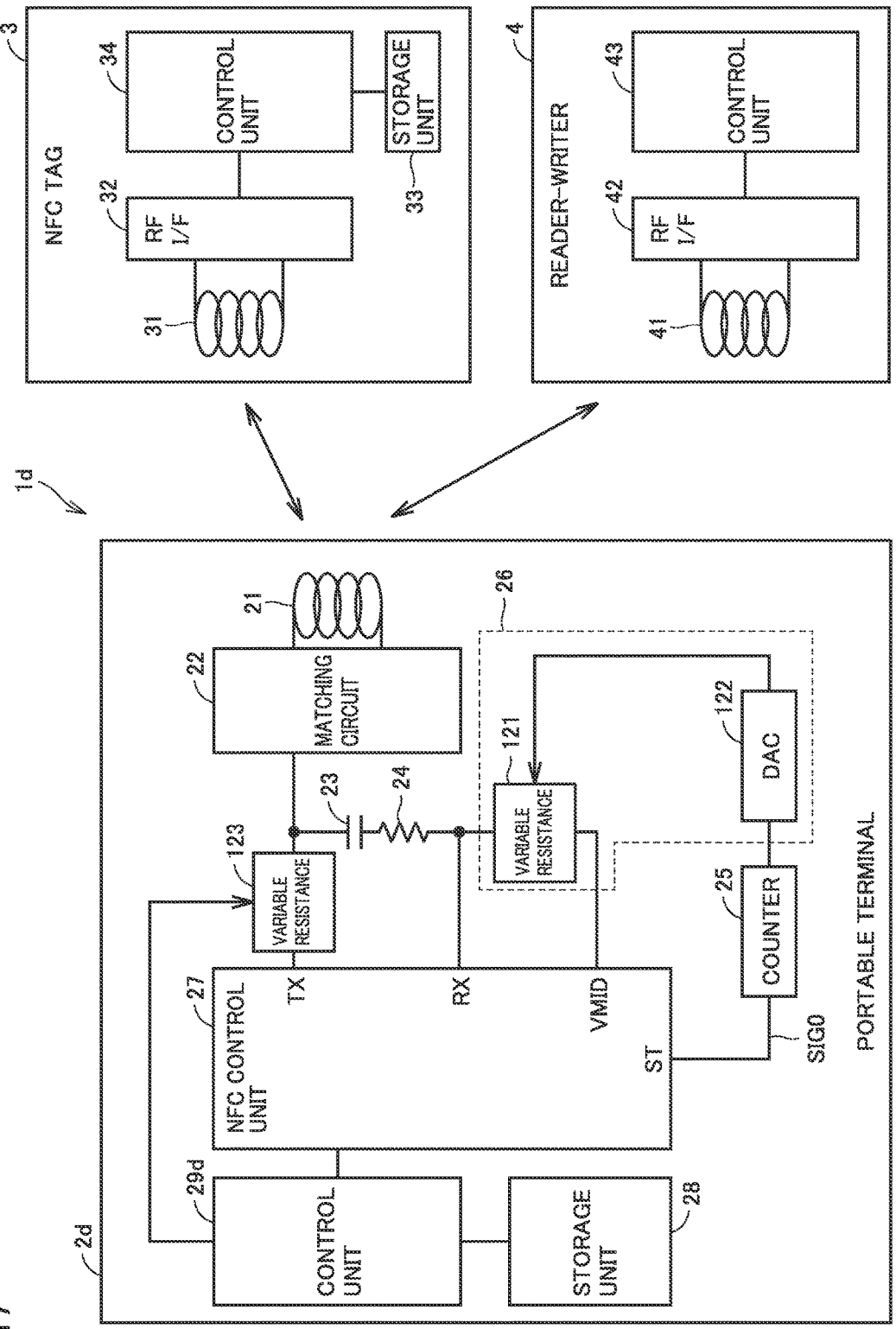
FIG. 17 is a block diagram showing a functional configuration of a communication system according to a third embodiment.

A communication system 1d according to a third embodiment will be described below with reference to FIG. 17. Communication system 1d includes a portable terminal 2d, NFC tag 3, and reader-writer 4. Communication system 1d in FIG. 17 is different from communication system 1 in FIG. 1 in replacement of portable terminal 2 with portable terminal 2d.

<2. Portable Terminal 2d>

Portable terminal 2d adjusts a gain of a received signal during communication, with a simplified circuit constituted of a counter, a DA converter, and a voltage division resistance as being combined, without using a large-scale circuit such as a circuit for measuring an RSSI. Furthermore, portable terminal 2d achieves lowering in current consumption in communication in the active mode, similarly to portable terminal 2b in FIG. 8.

<2-1. Configuration>

Portable terminal 2d further includes variable resistance 123 between terminal TX and matching circuit 22, as compared with portable terminal 2 in FIG. 1. Variable resistance 123 is implemented by a variable resistor of which resistance value is varied in accordance with a control signal input from a control unit 29d. Specifically, when the control signal is set to the H level, variable resistance 123 has resistance value Ra. When the control signal is set to the L level, variable resistance 123 has resistance value Rb. Resistance value Ra is set, for example, to 0Ω. Resistance value Rb is greater than resistance value Ra and it is set, for example, to approximately 1 to 2Ω. By switching between the resistance values of variable resistance 123, magnitude of a current which flows to antenna 21 is varied. Thus, magnitude of magnetic field generated in antenna 21, that is, intensity of carrier waves, varies.

Control unit 29d can include at least one processor and a memory and can control overall operations of portable terminal 2d. Each function of control unit 29d is implemented by execution of a program stored in a memory by at least one processor. Control unit 29d can include, as a main function, a function for control for implementing the reader-writer function in portable terminal 2d and for control for implementing the card emulation function.

<2-2. Communication Control Function of NFC Control Unit 27>

The communication function in the active mode and the communication function in the passive mode of NFC control unit 27 are basically similar to the communication control function of NFC control unit 27 in portable terminal 2 in FIG. 1.

NFC control unit 27 is further configured to vary magnitude of magnetic field generated in antenna 21 (intensity of carrier waves) as a communication function in the active mode, as will be described below.

(1) Case that Communication with NFC Tag 3 is Established

Change in intensity of carrier waves and resistance value of variable resistance 123 when communication with NFC tag 3 is established such as when portable terminal 2d is proximate to NFC tag 3 will be described.

When the communication mode is switched to the active mode, portable terminal 2d initially can start polling processing. In polling processing, portable terminal 2d can transmit a polling request frame. During the polling processing, control unit 29d can output a control signal at the H level to variable resistance 123. A resistance value of variable resistance 123 is set to Ra (0Ω by way of example) in response to reception of the control signal at the H level.

During the polling processing, control unit 29d can determine whether or not a reply has been given from NFC tag 3. Whether or not a reply has been given can be determined based on whether or not NFC control unit 27 can normally receive a polling response frame from NFC tag 3 within a prescribed period (50 ms). When a reply has been given within the prescribed period, control unit 29d can communicate with NFC tag 3 by means of NFC control unit 27.

When communication with NFC tag 3 is established, control unit 29d can output a control signal with its level being switched from the H level to the L level. A resistance value of variable resistance 123 is thus switched from Ra (0Ω by way of example) to Rb (1 to 2Ω by way of example). With increase in resistance value of variable resistance 123, a value of a current which flows in antenna 21 is smaller. Consequently, magnetic field generated in antenna 21 after start of communication is lower in magnitude than magnetic field generated during polling processing.

Control unit 29d can maintain a resistance value of variable resistance 123 at Rb while communication with NFC tag 3 is established. When communication is completed, NFC control unit 27 can resume polling processing. Control unit 29d can output the control signal with its level being switched from the L level to the H level after completion of communication. Since a resistance value of variable resistance 123 thus returns to Ra, a value of a current which flows in antenna 21 also returns to a value of a current during polling processing.

(2) Case that Communication with NFC Tag 3 is Disrupted

When communication is started with a current fed to antenna 21 being lowered as above, communication may be disrupted due to a greater distance of NFC tag 3 from portable terminal 2d during communication. The reason for disruption of communication may be lowering in intensity of magnetic field generated from antenna 21 or lowering in signal input to terminal RX due to increase in resistance value of variable resistance 123. In portable terminal 2d according to the third embodiment, when communication between portable terminal 2d and NFC tag 3 is disrupted, a resistance value of variable resistance 123 or a gain of a received signal is varied.

Specifically, when communication with NFC tag 3 is disrupted with resistance value Rb of variable resistance 123 having been switched after start of communication, gain change unit 26 can change a gain of the received signal from a present value to a maximum value. The "present value" refers to a gain of a received signal determined by a resistance value of variable resistance 121 (hereinafter also referred to as a "search value") at the time when communication between portable terminal 2d and NFC tag 3 is established in change in resistance value of variable resistance 121 in accordance with a voltage output from DAC 122 (a counter count value×0.1 V). The "maximum value" refers to a gain of a received signal determined by a maximum value (700Ω by way of example) of a resistance value of variable resistance 121 in accordance with a maximum value of a DAC output voltage (7×0.1 V by way of example).

NFC control unit 27 performs polling processing again after a gain is varied. When communication with NFC tag 3 is established again, gain change unit 26 can maintain a resistance value of variable resistance 121 at the maximum value while communication is established. A gain of the received signal is thus kept at the maximum value.

When communication with NFC tag 3 is not established even by change in gain of the received signal to the maximum value, control unit 29d can determine that lowering in signal input to terminal RX is not a main cause of disruption of communication. Control unit 29d can have the gain of the received signal return from the maximum value to an original value and then can switch a resistance value of variable resistance 123 from Rb to Ra. NFC control unit 27 can perform polling processing again. During polling processing, intensity of magnetic field generated from antenna 21 is higher than intensity of magnetic field during communication. When communication with NFC tag 3 is established again, control unit 29d can maintain a resistance value of variable resistance 123 to Ra while communication is established.

As set forth above, when communication with NFC tag 3 is disrupted, communication with NFC tag 3 can be established again by increasing a gain of a received signal or having a current fed to antenna 21 return to original magnitude. Thus, in portable terminal 2d having a function to adjust a gain of a received signal as well, current consumption during communication can be lowered within a range allowing ensured communication with NFC tag 3.

<3. Operations>
<3-1. Procedure in Communication Processing>

A procedure in communication processing in communication system 1d configured as above will be described with reference to FIG. 19, with processing in portable terminal 2d being focused on.

Definition of a status indicating a state of communication of portable terminal 2d will initially be described with reference to FIG. 18. By way of example, a status is set to three patterns of "0", "1", and "2". When the status is set to "0", a resistance value of variable resistance 123 is set to Ra during polling processing and a resistance value of variable resistance 123 is set to Rb during communication. A resistance value of variable resistance 121 of gain change unit 26 is set to a search value.

In contrast, when the status is set to "1", a resistance value of variable resistance 123 is set to Ra during polling processing and a resistance value of variable resistance 123 is set to Ra also during communication. A resistance value of variable resistance 121 of gain change unit 26 is set to a search value.

When the status is set to "2", a resistance value of variable resistance 123 is set to Ra during polling processing and a resistance value of variable resistance 123 is set to Rb during communication. A resistance value of variable resistance 121 of gain change unit 26 is set to a maximum value. Control unit 29d can set the status to any of "0", "1", and "2" in accordance with a state of communication in NFC control unit 27.

Figure 19:
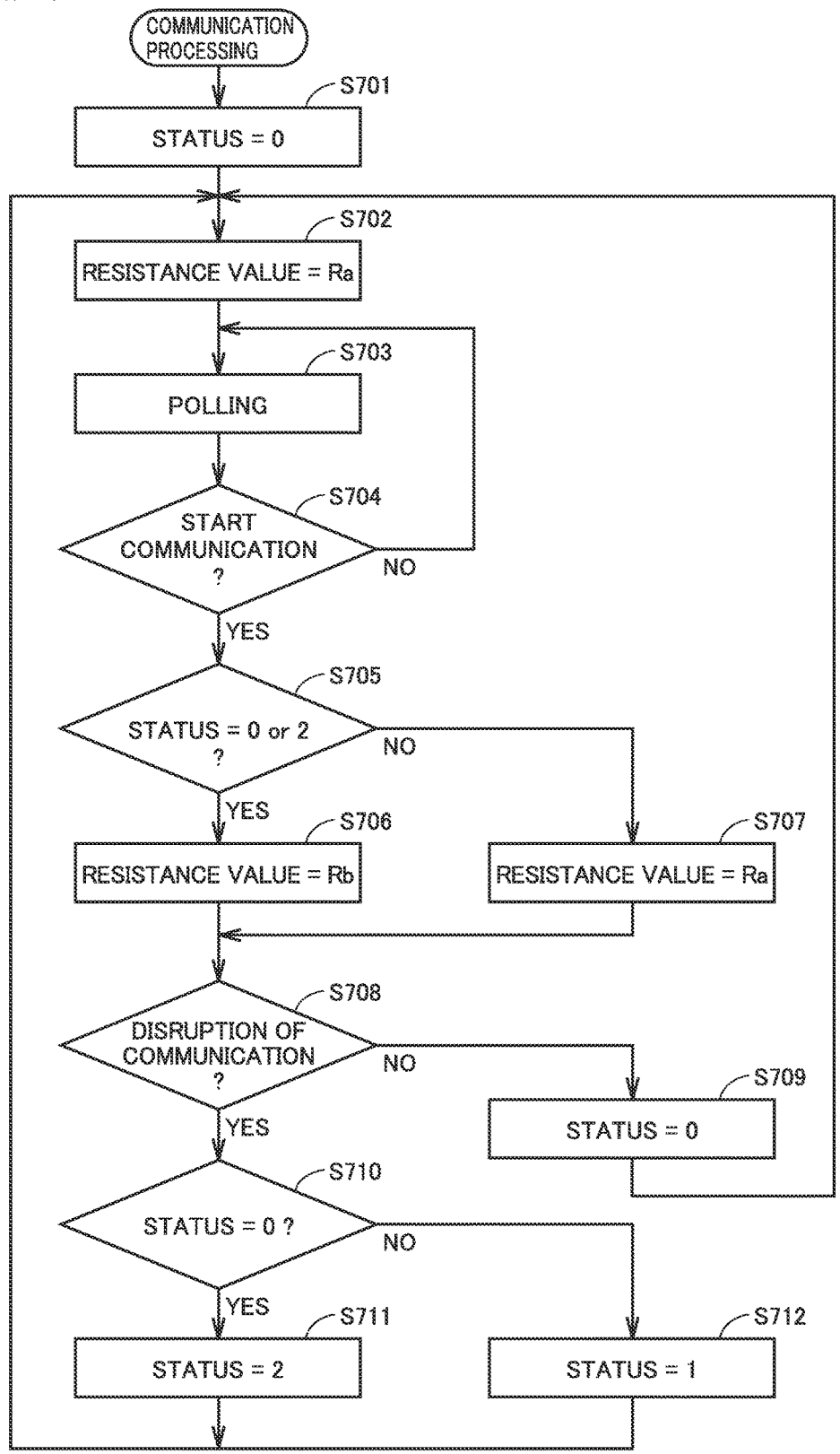
FIG. 19 is a flowchart showing a procedure in communication processing in the communication system according to the third embodiment.

Referring to FIG. 19, when communication processing is started, portable terminal 2d can initially perform polling processing. In step S701, control unit 29d can set the status to "0". In step S702, control unit 29d can set a resistance value of variable resistance 123 to Ra by outputting a control signal at the H level to variable resistance 123. In step S703, NFC control unit 27 can start polling processing. NFC control unit 27 can transmit a polling request frame.

In step S704, control unit 29d can determine whether or not communication with NFC tag 3 has been started based on a reply given from NFC tag 3 within a prescribed period. When a polling response frame could not normally be received from NFC tag 3 within the prescribed period, control unit 29d can determine that communication with NFC tag 3 has not been started (determination as NO in step S704), and the process returns to step S703, in which polling processing can be continued.

When it is determined that communication with NFC tag 3 has been started (determination as YES in step S704), control unit 29d can determine in step S705 whether or not the status has been set to "0" or "2". When the status has been set to "0" or "2" (determination as YES in step S705), control unit 29d can set a resistance value of variable resistance 123 to Rb by outputting a control signal at the L level to variable resistance 123. Thus, a value of a current which flows in antenna 21 during communication with NFC tag 3 is smaller than a value of a current which flows in antenna 21 during polling processing.

When the status has not been set to "0" or "2", that is, when the status has been set to "1" (determination as NO in step S705), the process proceeds to step S707 and control unit 29d sets a resistance value of variable resistance 123 to Ra by outputting a control signal at the H level to variable resistance 123. Thus, a value of a current which flows in antenna 21 during communication with NFC tag 3 is equal to a value of a current which flows in antenna 21 during polling processing.

In step S708, control unit 29d determines whether or not communication with NFC tag 3 has been disrupted. When it is determined that communication with NFC tag 3 has been disrupted (determination as YES in step S708), control unit 29d can further determine in step S710 whether or not the status has been set to "0". When the status has been set to "0" (determination as YES in step S710), control unit 29d can change the status to "2" in step S711. Since a resistance value of variable resistance 121 of gain change unit 26 can thus be switched from the search value to the maximum value, a gain of the received signal is set to the maximum value. After control unit 29d changes the status to "2", the process can return to step S702. Thus, with a resistance value of variable resistance 123 being set to Ra in step S702, the process proceeds to step S703 and polling processing is performed again. When communication with NFC tag 3 is established and communication is started, a gain of the received signal can be maintained at the maximum value while communication is established.

In contrast, when the status has not been set to "0" in step S710, that is, the status has been set to "2" (determination as NO in step S710), control unit 29d can change the status to "1" in step S712. Since a resistance value of variable resistance 121 of gain change unit 26 is thus switched from the maximum value to the search value, the gain of the received signal can return to an original value. Control unit 29d can set a resistance value of variable resistance 123 to Ra by outputting a control signal at the H level to variable resistance 123. After control unit 29d changes the status to "1", the process can return to step S702. Thus, with a resistance value of variable resistance 123 being set to Ra in step S702, the process proceeds to step S703 and polling processing is performed again. When communication with NFC tag 3 is established and communication is started, a current which flows in antenna 21 while communication is established is maintained at a value equal to a value of a current which flows in antenna 21 during polling processing.

When it is determined in step S708 that communication with NFC tag 3 has not been disrupted (determination as NO in step S708), the process proceeds to step S709 and control unit 29d can set the status to "0" in response to successful completion of communication with NFC tag 3. Thereafter, the process returns to step S702, so that polling processing is performed again with a resistance value of variable resistance 123 being set to Ra.

<4. Modification and Others>

(1) In the first to third embodiments described above, though the ASK scheme and the ASK 10% scheme are employed as a data modulation scheme, other schemes such as phase shift keying (PSK) or quadrature amplitude modulation (QAM) may be employed. A degree of modulation of amplitude is not limited to 10% or 100% either and a suitable degree such as 30% or 50% may be employed.

Though Manchester coding is employed as a data coding scheme in the first to third embodiments described above, other coding schemes may be employed. For example, modified Miller coding or non return zero (NRZ) may be employed.

Though a frequency of carrier waves is set to 13.56 MHz and a rate of communication of data is set to 212 kbps in the first to third embodiments described above, other values may be employed.

(2) In the first and third embodiments described above, counter 25, variable resistance 121, and DAC 122 are configured such that a resistance value of variable resistance 121 varies from 0Ω to 700Ω. A resistance value, however, should only be determined such that a level of a signal input to RX is accommodated in a range of input to an AD converter contained in NFC control unit 27 for restoring data from the signal input to RX. For example, a resistance value of variable resistance 121 may exceed 700Ω or a resistance value of resistance 24 may be set to a value other than 500Ω.

Though a resistance value of variable resistance 121 is varied by 100Ω in the first and third embodiments described above, it may be varied by a smaller value (for example, 50Ω) or by a greater value (for example, 200Ω).

(4) Though counter 25 is implemented by a 3-bit counter IC which counts up by 1 representing a prescribed unit number in the first and third embodiments described above, the counter may count down. The prescribed unit number may be set to a value other than 1.

Counter 25 should only be able to generate each value to be generated as a count value (0 to 7 in an embodiment) at a substantially equal probability. For example, counter 25 may be implemented by a device which randomly generates any numeric value from 0 to 7 each time a falling edge of a pulse is detected.

Though counter 25 detects a falling edge of an input pulse, limitation thereto is not intended and it may detect a rising edge of a pulse or both of a rising edge and a falling edge.

(5) In the first and third embodiments described above, a voltage of a signal input to RX is adjusted by changing a ratio of voltage division of a voltage division resistance in accordance with a voltage output from DAC 122. Other than the voltage division resistance, however, a voltage of a signal input to RX should only be adjusted with a simplified configuration in accordance with a voltage output from DAC 122.

For example, with a signal output from DAC 122 being employed as a signal for control, an element such as a transistor or an operational amplifier which outputs an input signal with an amplification factor being varied in accordance with a voltage of a signal for control may be employed, and a signal output from such an element may be input to RX.

(6) In the first to third embodiments described above, when portable terminals 2 and 2a to 2d operate as contactless IC cards and portable terminals 2 and 2a to 2d communicate with reader-writer 4, only reader-writer 4 outputs carrier waves. More specifically, when portable terminals 2 and 2a to 2d transmit data to reader-writer 4, data is transmitted with carrier waves output from reader-writer 4 being subjected to load modulation by portable terminals 2 and 2a to 2d. In transmission of data, however, instead of load modulation as described above, portable terminals 2 and 2a to 2d may transmit the data by generating carrier waves from the portable terminals themselves and outputting to reader-writer 4, carrier waves as being modulated with data to be transmitted.

In the first to third embodiments described above, only portable terminals 2 and 2a to 2d output carrier waves when portable terminals 2 and 2a to 2d communicate with NFC tag 3. More specifically, when NFC tag 3 transmits data to portable terminals 2 and 2a to 2d, data is transmitted as NFC tag 3 subjects carrier waves output from portable terminals 2 and 2a to 2d to load modulation. When NFC tag 3 has a function to generate carrier waves from the NFC tag itself and to transmit data over the generated carrier waves, however, it may transmit data to portable terminals 2 and 2a to 2d with this function.

(7) A control program written in a machine language for having each of processing for implementing the reader-writer function and processing for implementing the card emulation function shown in the first to third embodiments described above performed by a processor of portable terminals 2 and 2a to 2d and various circuits connected to the processor or in a program code of a high-level language can also be recorded in a recording medium or distributed through various communication paths. Such a recording medium includes an IC card, a hard disk, an optical disc, a flexible disc, a ROM, and a flash memory. The distributed control program is used as being stored in a memory which can be read by a processor and each function as shown in each embodiment is implemented as the processor executes the control program. The processor may execute the control program not only directly but also by compiling or by means of an interpreter.

(8) Each functional component (matching circuit 22, NFC control unit 27, control units 29 and 29b to 29d, RF I/F 32, RF I/F 42, and control unit 34) shown in the first to third embodiments described above may be implemented by a circuit executing the function or by execution of a program by one processor or a plurality of processors.

The term "unit" as used herein refers to known structures such as hardware, firmware, non-transitory computer-readable media that stores computer-executable instructions, or any combination of these elements, for performing the associated functions described herein. Additionally, various units can be discrete units; however, as would be apparent to one of ordinary skill in the art, two or more units may be combined to form a single unit that performs the associated functions according to various embodiments of the invention. Conversely, a single unit may be divided into two or more units that perform respective associated functions according to various embodiments of the invention.

(9) The first to third embodiments and each modification described above may partially be combined.

It should be understood that embodiments disclosed herein are illustrative and non-restrictive in every respect. The scope of the present disclosure is defined by the terms of the claims, rather than the description above, and is intended to include any modifications within the scope and meaning equivalent to the terms of the claims.

The invention claimed is:

1. A portable terminal comprising:
an antenna;
a communication unit;
an N-bit counter, with N being a natural number; and
a gain change unit,
the communication unit having two modes of an active mode in which the communication unit itself outputs carrier waves and a passive mode in which carrier waves output from another device are used, the communication unit being configured to attempt communication through electromagnetic induction by using the antenna with alternately switching between the two modes and to communicate without switching between the modes while communication is established,
the N-bit counter being configured to output a value that varies by a unit number each time switching to at least one of the two modes is made in the communication unit, and
the gain change unit being configured to change a gain of a signal received at the antenna by the communication unit in accordance with the value output from the N-bit counter.

2. The portable terminal according to claim 1, wherein
the communication unit outputs a state signal to the N-bit counter, the state signal being set to a first level when switching to the active mode is made, the state signal being set to a second level when switching to the passive mode is made, and
the N-bit counter determines that:
(i) switching to the active mode is made in the communication unit when the state signal makes transition from the second level to the first level; and
(ii) switching to the passive mode is made in the communication unit when the state signal makes transition from the first level to the second level.

3. The portable terminal according to claim 1, wherein
when one of the communication unit and a communication counterpart ends output of carrier waves, another one starts output of carrier waves after lapse of a prescribed time period or longer after the output of carrier waves is ended, and
the N-bit counter detects carrier waves output from the communication unit and the communication counterpart and determines that switching to at least one of the two modes is made when transition from a state that the carrier waves are not detected to a state that the carrier waves are detected.

4. The portable terminal according to claim 1, wherein
the gain change unit includes a voltage division resistance and a DA converter,
the voltage division resistance includes a fixed resistance and a variable resistance of which resistance value varies in accordance with a level of an input signal, and divides a voltage of a signal received at the antenna at a ratio between a resistance value of the fixed resistance and a resistance value of the variable resistance, and
the DA converter accepts a value output from the N-bit counter as an input and outputs a signal at a level in accordance with the accepted value to the variable resistance.

5. The portable terminal according to claim 1, wherein
the N-bit counter holds, as the value which varies by the unit number, a count value which is variable to an integer value from one end value to another end value and expressed with N bits, each time switching to at least one of the two modes is made in the communication unit, the N-bit counter outputs the count value, the count value is varied to a second end value when the count value attains to a first end value of two end values, and the count value is varied by the unit number when the count value has not attained to the first end value.

6. The portable terminal according to claim 1, wherein the N-bit counter maintains an output value constant while communication by the communication unit is established, and the gain change unit maintains the gain constant while communication by the communication unit is established.

* * * * *